United States Patent
Peng et al.

(10) Patent No.: US 11,482,473 B2
(45) Date of Patent: Oct. 25, 2022

(54) SEMICONDUCTOR DEVICE, AND ASSOCIATED METHOD AND SYSTEM

(71) Applicant: TAIWAN SEMICONDUCTOR MANUFACTURING COMPANY LTD., Hsinchu (TW)

(72) Inventors: Shih-Wei Peng, Hsinchu (TW); Chia-Tien Wu, Taichung (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 389 days.

(21) Appl. No.: 16/679,070

(22) Filed: Nov. 8, 2019

(65) Prior Publication Data
US 2021/0098339 A1    Apr. 1, 2021

Related U.S. Application Data

(60) Provisional application No. 62/908,030, filed on Sep. 30, 2019.

(51) Int. Cl.
H01L 23/48    (2006.01)
H01L 21/48    (2006.01)

(52) U.S. Cl.
CPC ........ *H01L 23/481* (2013.01); *H01L 21/4828* (2013.01)

(58) Field of Classification Search
CPC .......................... H01L 23/481; H01L 21/4828
USPC .......................................................... 257/774
See application file for complete search history.

(56) References Cited

U.S. PATENT DOCUMENTS 8,836,029 B2 *  9/2014  Illegems  ........... H01L 29/41758
257/349

* cited by examiner

*Primary Examiner* — Monica D Harrison
(74) *Attorney, Agent, or Firm* — WPAT Law; Anthony King

(57) ABSTRACT

A semiconductor device, including a first metal strip extending in a first direction on a first plane; a second metal strip extending in the first direction on a second plane over the first metal strip; a third metal strip immediate adjacent to the second metal strip and extending in the first direction on the second plane; and a fourth metal strip immediate adjacent to the third metal strip and extending in the first direction on the second plane; wherein the first metal strip and the second metal strip are directed to a first voltage source; wherein a distance between the second metal strip and the third metal strip is greater than a distance between the third metal strip and the fourth metal strip.

20 Claims, 50 Drawing Sheets

```
┌────────────────────────────────────────────────────────────────────────────┐
│ forming a plurality of first metal strips extending in a first direction on a first plane │──81
└────────────────────────────────────────────────────────────────────────────┘
                                      │
                                      ▼
┌────────────────────────────────────────────────────────────────────────────┐
│ forming a plurality of second metal strips extending in the first direction on a second │
│ plane over the first plane by executing a photolithography operation with a single      │──82
│ mask, wherein a first second metal strip is disposed over a first first metal strip     │
└────────────────────────────────────────────────────────────────────────────┘
```

80

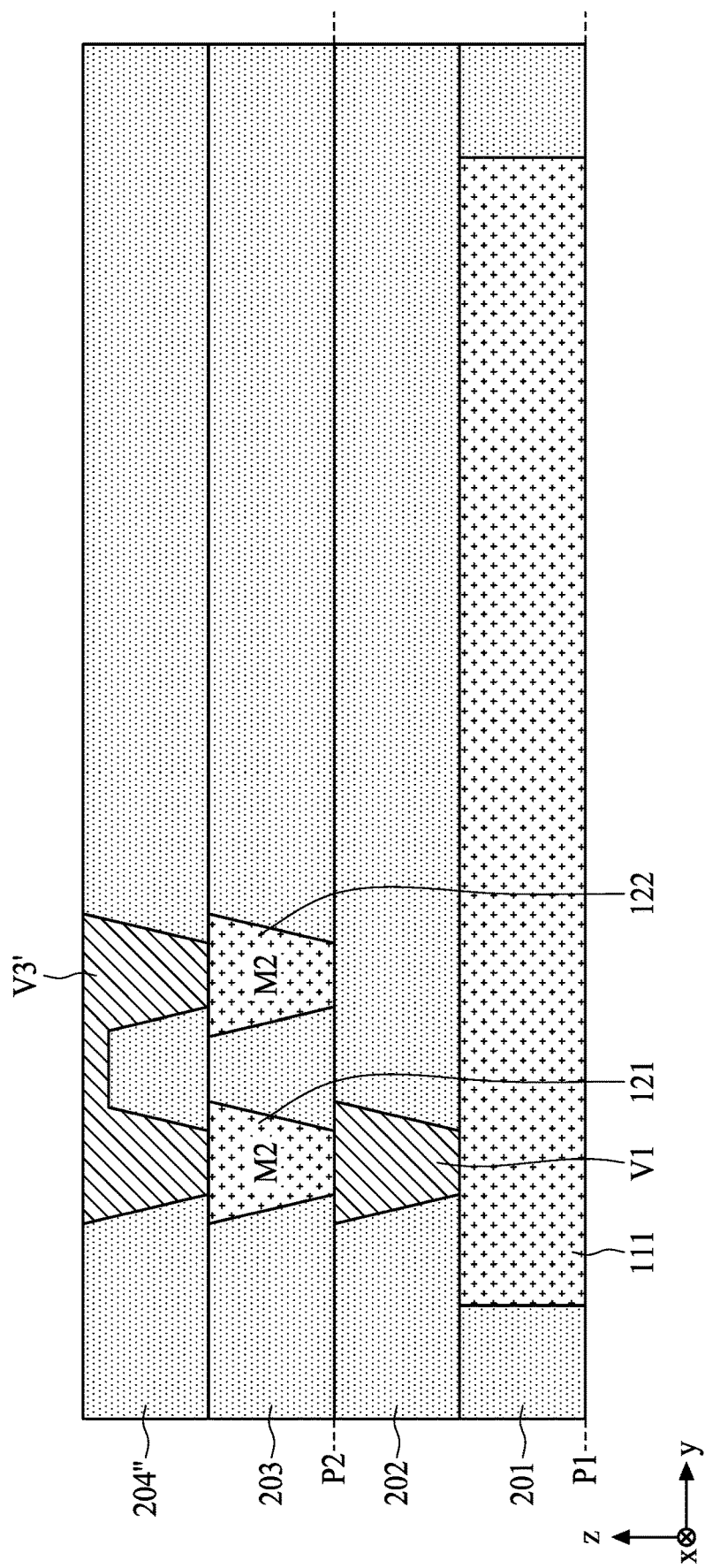

SEMICONDUCTOR DEVICE, AND ASSOCIATED METHOD AND SYSTEM

CROSS-REFERENCE TO RELATED APPLICATION

This application claims the benefit of U.S. Provisional Application No. 62/908,030, filed on Sep. 30, 2019, which is incorporated by reference in its entirety.

BACKGROUND

Due to the advanced process of manufacturing semiconductor devices, a size of a semiconductor device is reduced. With the small size, a resistance of a contact via in the semiconductor device is inevitably high, which introduces a bad influence to the cell speed and the IR drop.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A to 7C are diagrams illustrating a process of manufacturing a semiconductor device based on the embodiments of FIGS. 5A to 5D.

DETAILED DESCRIPTION

Figure 1:
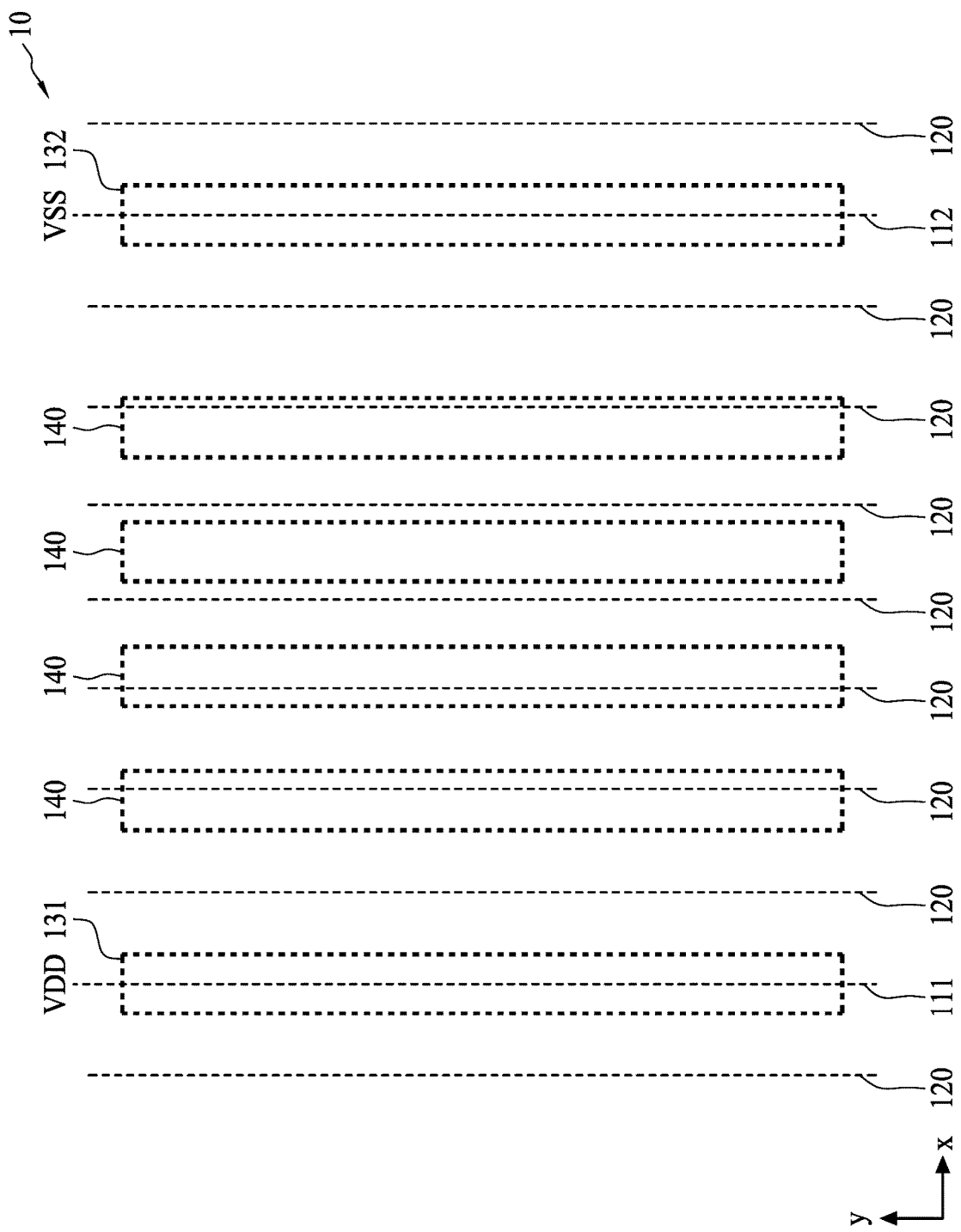
FIG. 1 is a top-view diagram illustrating a semiconductor device in accordance with an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With the advanced process of manufacturing semiconductor devices, a size of a semiconductor device is reduced. With the small size, a resistance of a contact via has become a key factor affecting the IR drop and the cell speed of the semiconductor device. For example, when a cell height of a cell in the semiconductor device is in a range from 90 to 100 nm, the high resistance of the contact vias located on a path directed to a voltage source (e.g., VDD or VSS) introduces an increase of the IR drop up to about 100%, and which causes a poor performance of the semiconductor device. For another example, when a cell height of a cell in the semiconductor device is in a range from 105 to 110 nm, the high resistance of the contact vias located on a path directing to a voltage source (e.g., VDD or VSS) introduces an increase of the IR drop up to 20 to 25%, and which causes a poor performance of the semiconductor device.

Therefore, the present disclosure proposes a semiconductor device, and associated method and system, in which the resistance of the contact vias can be effectively reduced. As a result, the increase of the IR drop can also be reduced. To reduce the high resistance of contact vias located on a path directed to a voltage source (e.g., VDD or VSS), the positions of metal strips which are directed to a voltage source (e.g., VDD or VSS) are aligned in this present disclosure to provide contact vias in various forms in a semiconductor device.

FIG. 1 is a top-view diagram illustrating a part of a semiconductor device 10 in accordance with an embodiment of the present disclosure. In FIG. 1, dash lines represent the positions of central lines of metal strips formed in a lower layer while dash strips represent the positions of metal strips formed in an upper layer. In this embodiment, the lower layer is a layer indicative of metal1 while the upper layer is a layer indicative of metal3. Those skilled in the art can readily understand that there should be a layer indicative of metal2 formed between the layer of metal1 and the layer of metal3, a layer indicative of VIA1 connecting between the layer of metal1 and the layer of metal2, and a layer indicative of VIA2 connecting between the layer of metal2 and the layer of metal3, which are not shown in FIG. 1 for tidiness and simplicity.

Specifically, the semiconductor device 10 includes metal strips 111, 112 and 120 extending in a first direction, for example, the "y" direction. The metal strips 111, 112 and 120 are formed in the layer of metal1. In addition, the metal strip 111 is directed to a voltage source VDD, while the metal strip 112 is directed to a voltage source VSS. The metal strips 120 are disposed at equal intervals between the metal strips 111 and 112. Moreover, the semiconductor device 10 further includes metal strips 131, 132 and 140 extending in the y direction. The metal strips 131, 132 and 140 are formed in the layer of metal3. In addition, the metal strip 131 is directed to the voltage source VDD while the metal strip 132 is directed to the voltage source VSS.

The metal strip 131 is aligned with the metal strip 111 in order to facilitate their connection to the voltage source VDD, and the metal strip 132 is aligned with the metal strip 112 in order to connect to the voltage source VSS. More specifically, a central line of the metal strip 131 is aligned with a central line of the metal strip 111 while a central line of the metal strip 132 is aligned with a central line of the metal strip 112.

In the semiconductor device 10 proposed by the present disclosure, the metal strips directed to the voltage sources VDD and VSS in the upper layer (e.g., the layer of metal3) are aligned with the metal strips directed to the voltage sources VDD and VSS in the lower layer (e.g., the layer of metal1), respectively. Such alignment allows contact vias between the lower layer and the upper layer to be designed in various forms in accordance with the present disclosure to reduce the relatively high resistance of contact vias that would otherwise occur in some existing semiconductor devices with non-aligned metal strips. However, the alignment is not limited to the layer of metal1 and the layer of metal3 as exemplarily proposed in the present disclosure.

For example, in another embodiment, the metal strips directed to the voltage sources in a layer indicative of metal5 are aligned with the metal strips directed to the voltage sources in the layer of metal3. As a result, the contact vias formed between the layer of metal3 and the layer of metal5 can be provided in various forms to reduce the high resistance of the contact vias. For another example, in yet another embodiment, the metal strips directed to the voltage sources in the layer of metal5 are aligned with the metal strips directed to the voltage sources in the layer of metal3, and the metal strips directed to the voltage sources in the layer of metal3 are aligned with the metal strips directed to the voltage sources in the layer of metal1. As a result, the contact vias formed between the layer of metal1 and the layer of metal5 can be provided in various forms to reduce the high resistance of the contact vias. The various designs of the contact vias will be described in the following paragraphs.

Figure 2A:
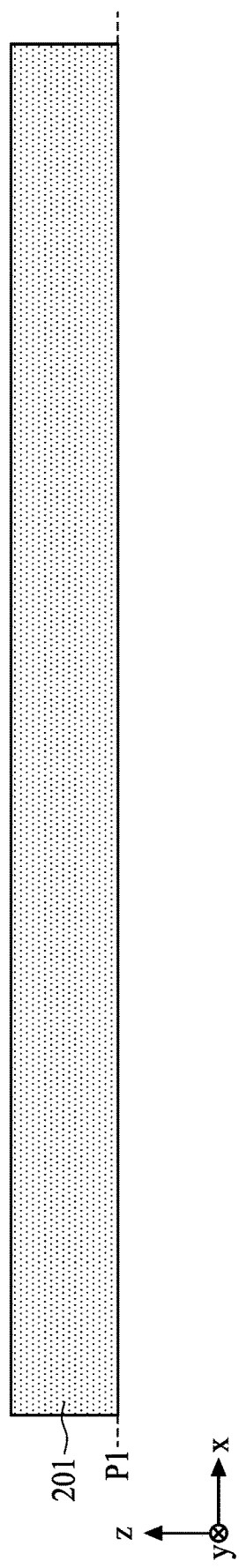
FIGS. 2A to 2T are cross-section views illustrating a part of a process of manufacturing a semiconductor device in accordance with an embodiment of the present disclosure.
Figure 2B:
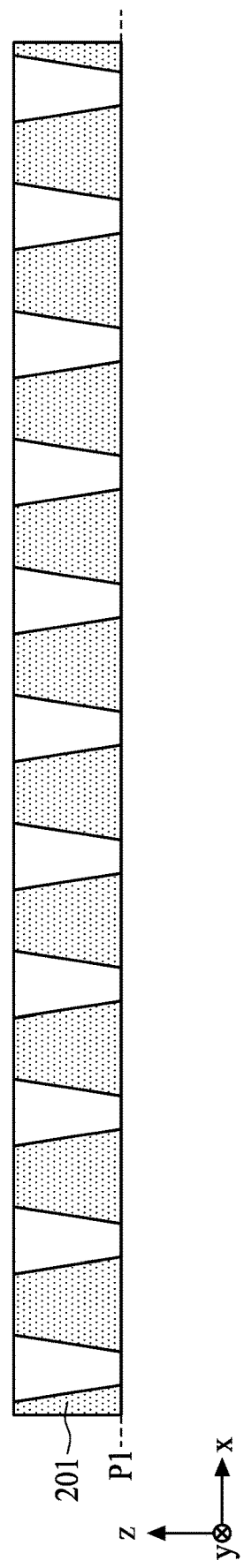
Figure 2C:
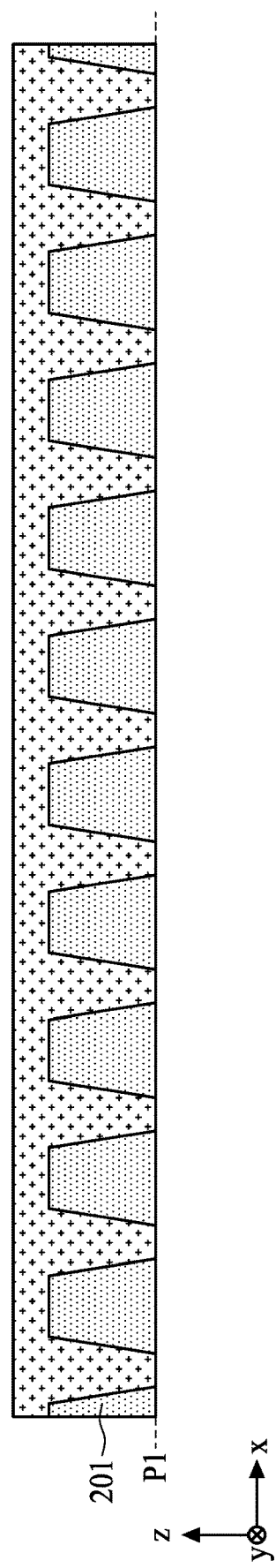
Figure 2D:
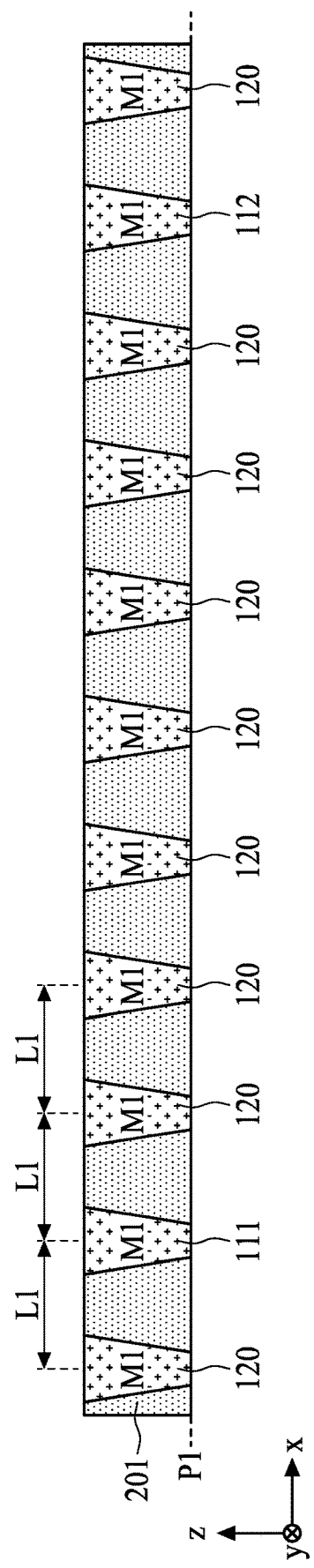
Figure 2E:
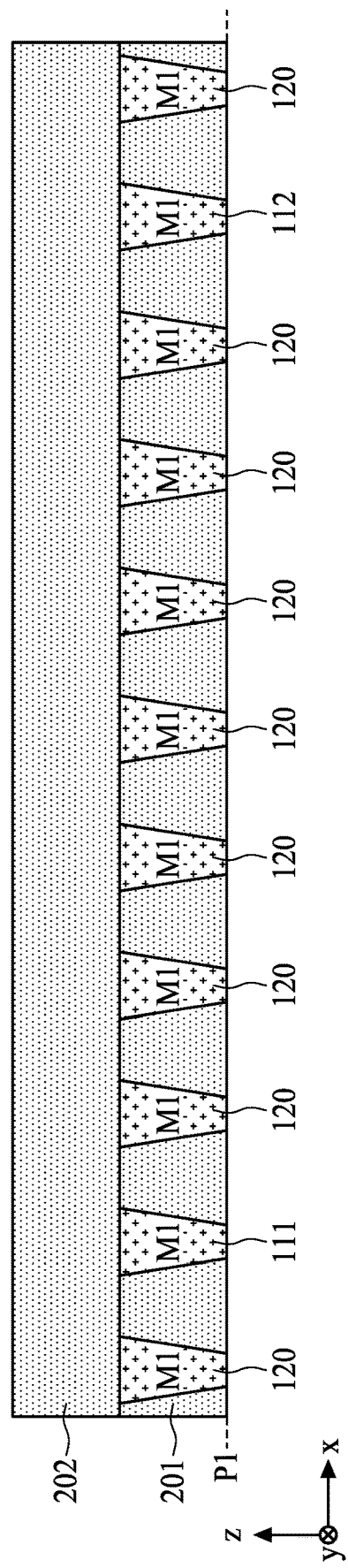
Figure 2F:
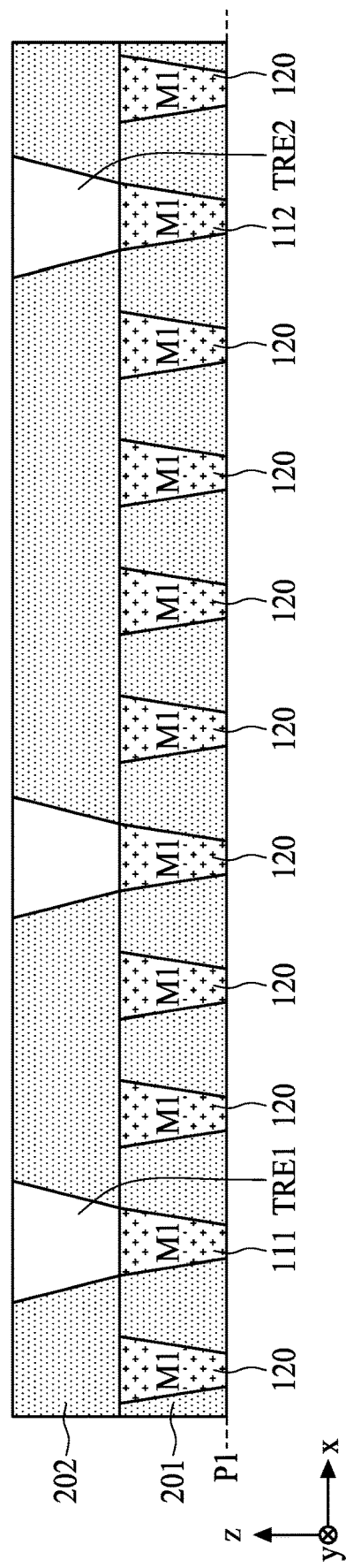
Figure 2G:
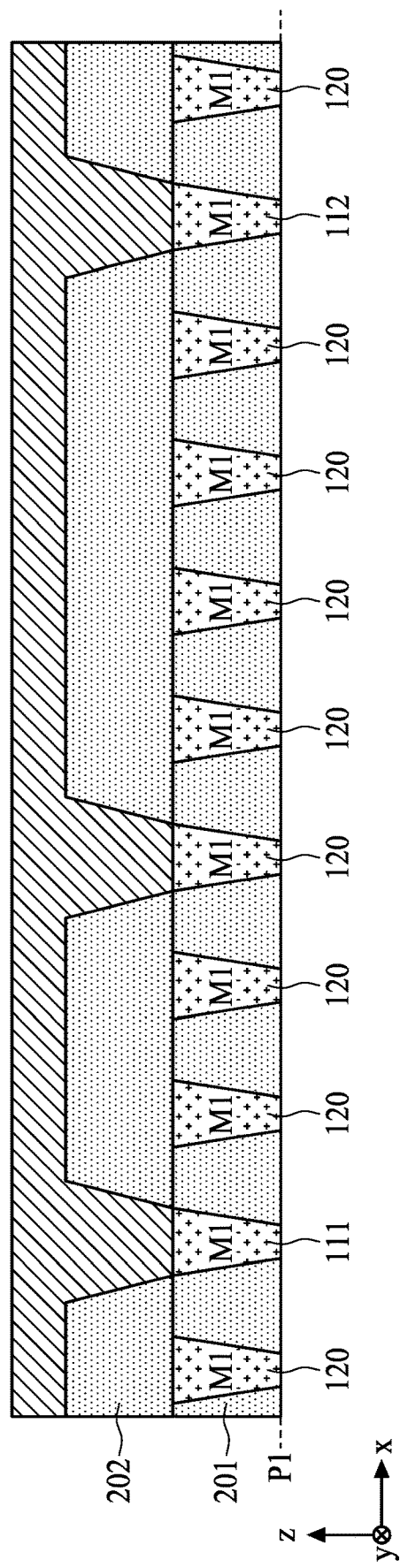
Figure 2H:
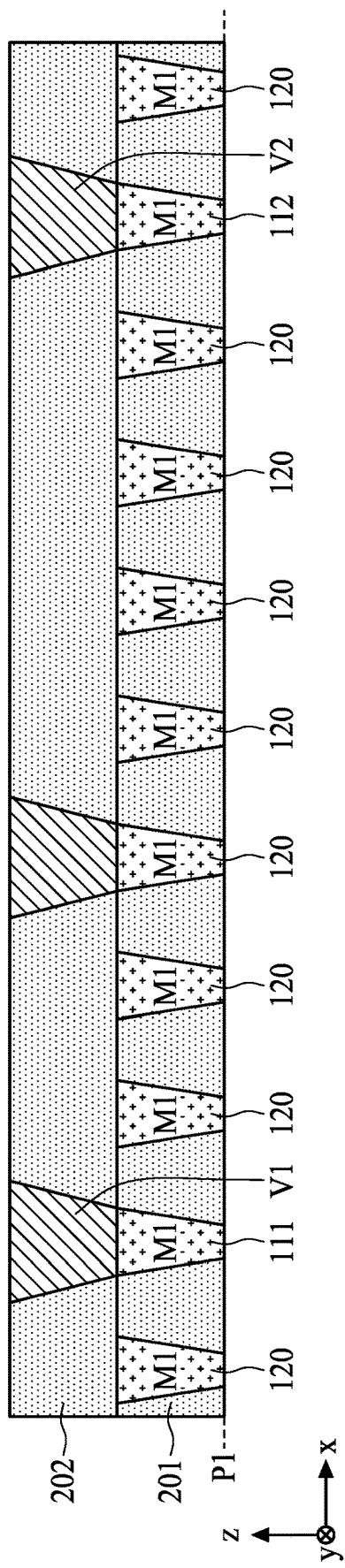
Figure 2I:
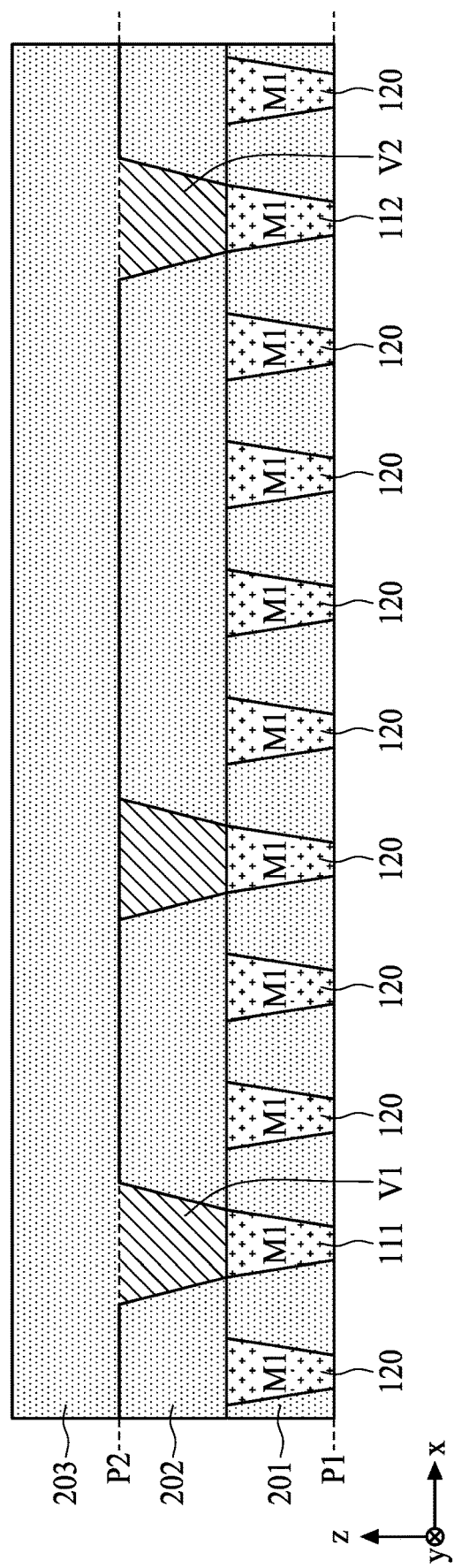
Figure 2J:
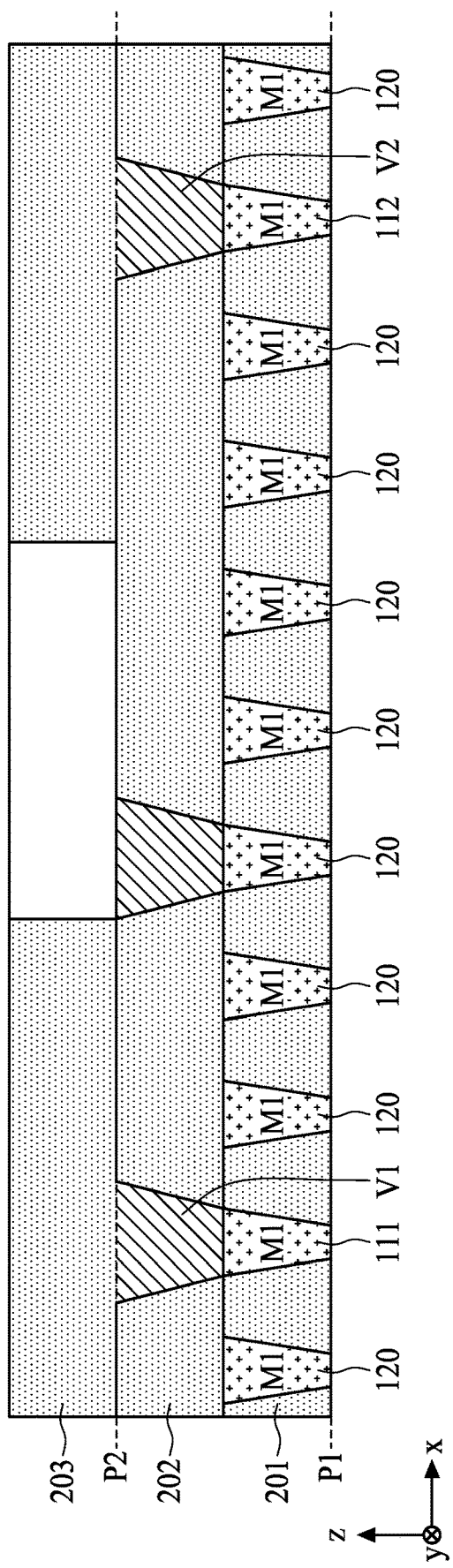
Figure 2K:
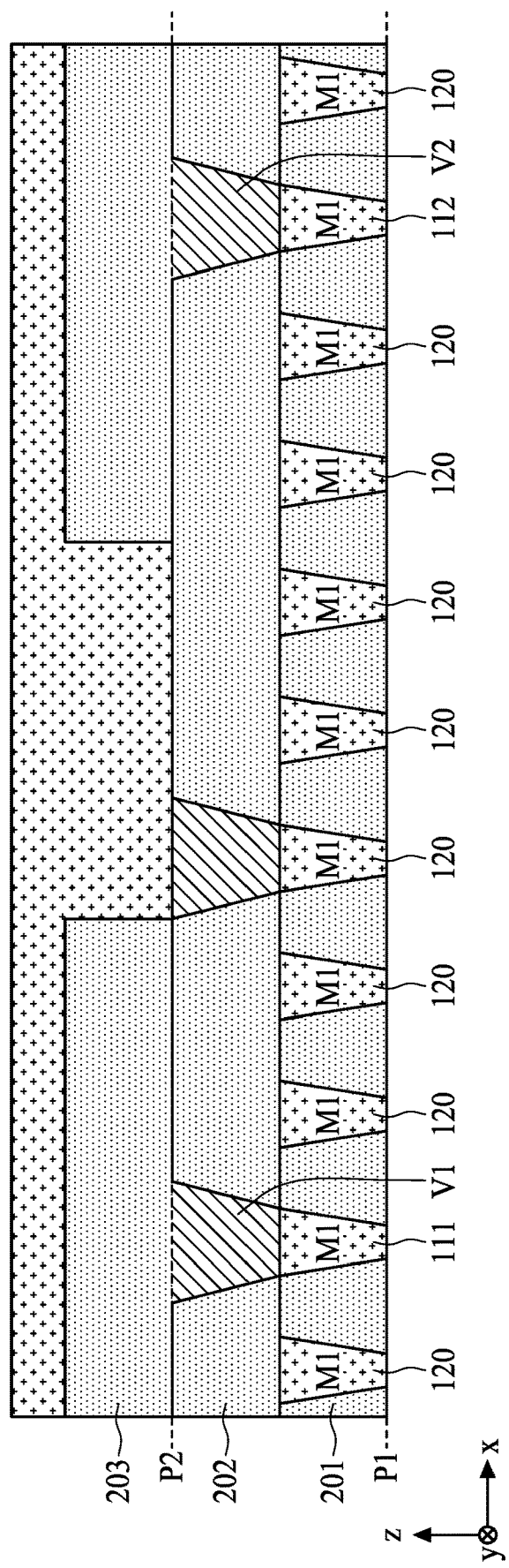
Figure 2L:
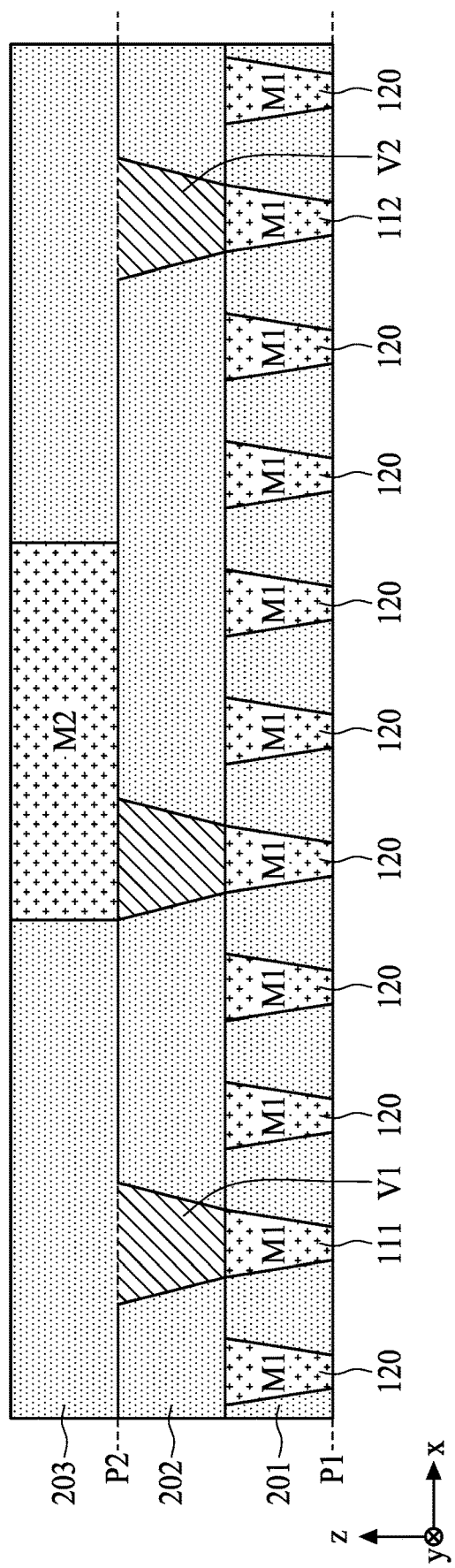
Figure 2M:
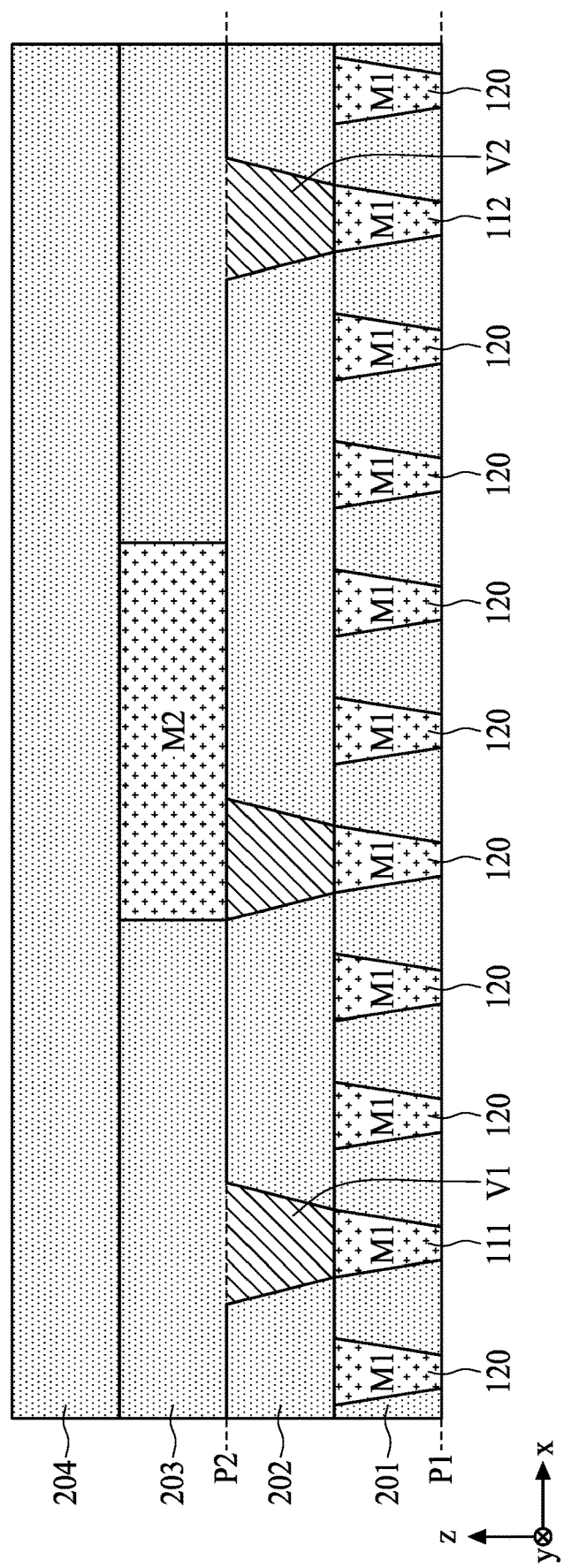
Figure 2N:
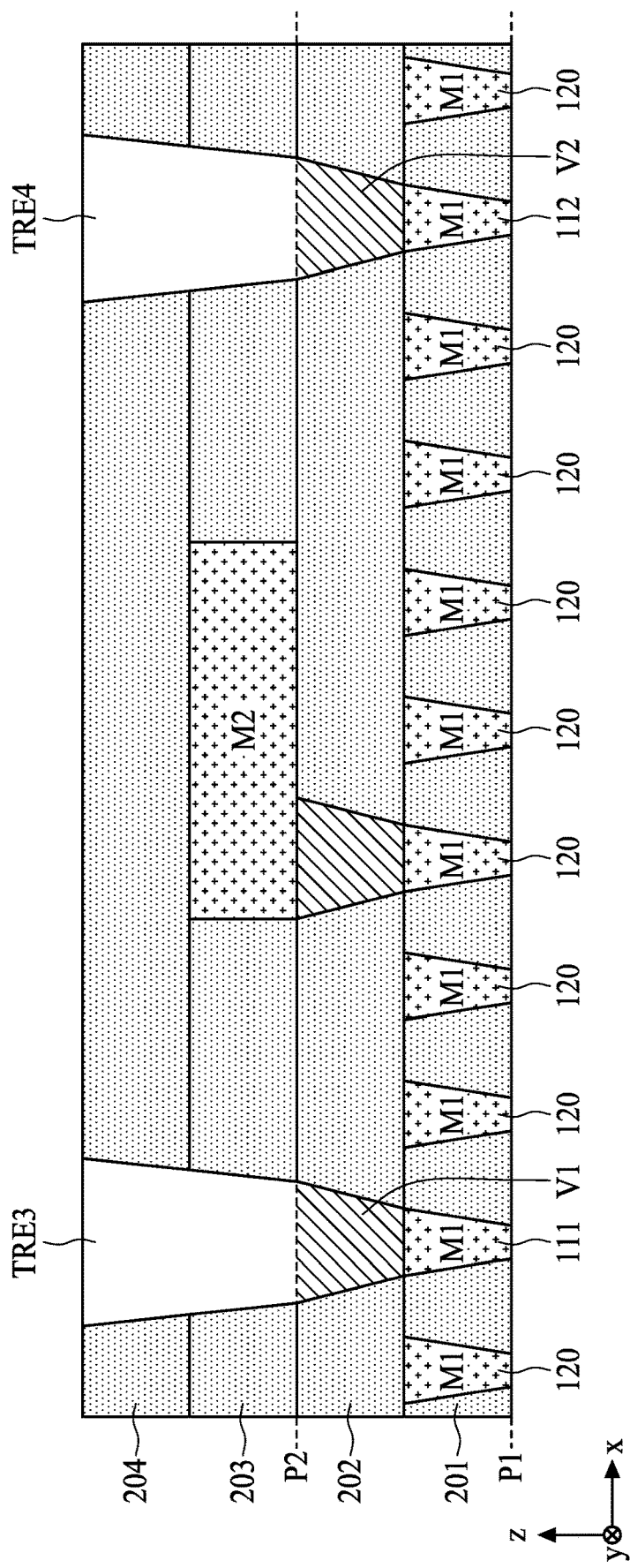
Figure 2O:
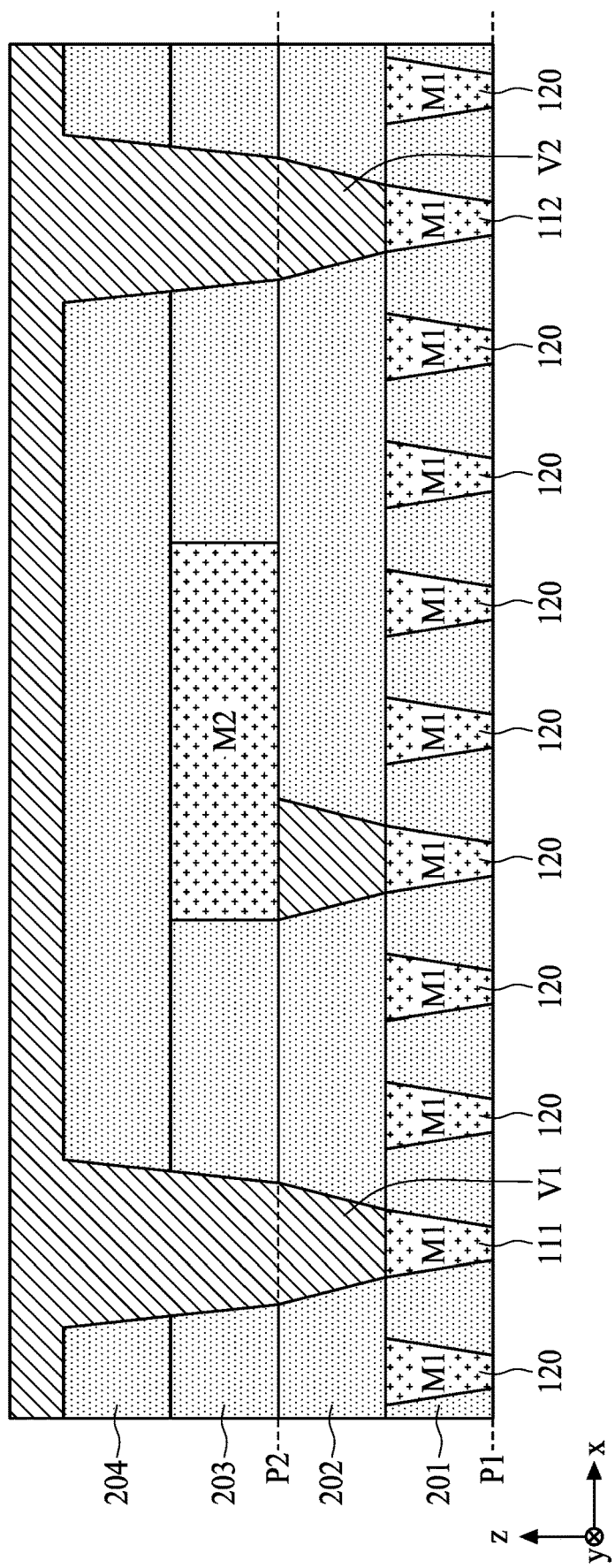
Figure 2P:
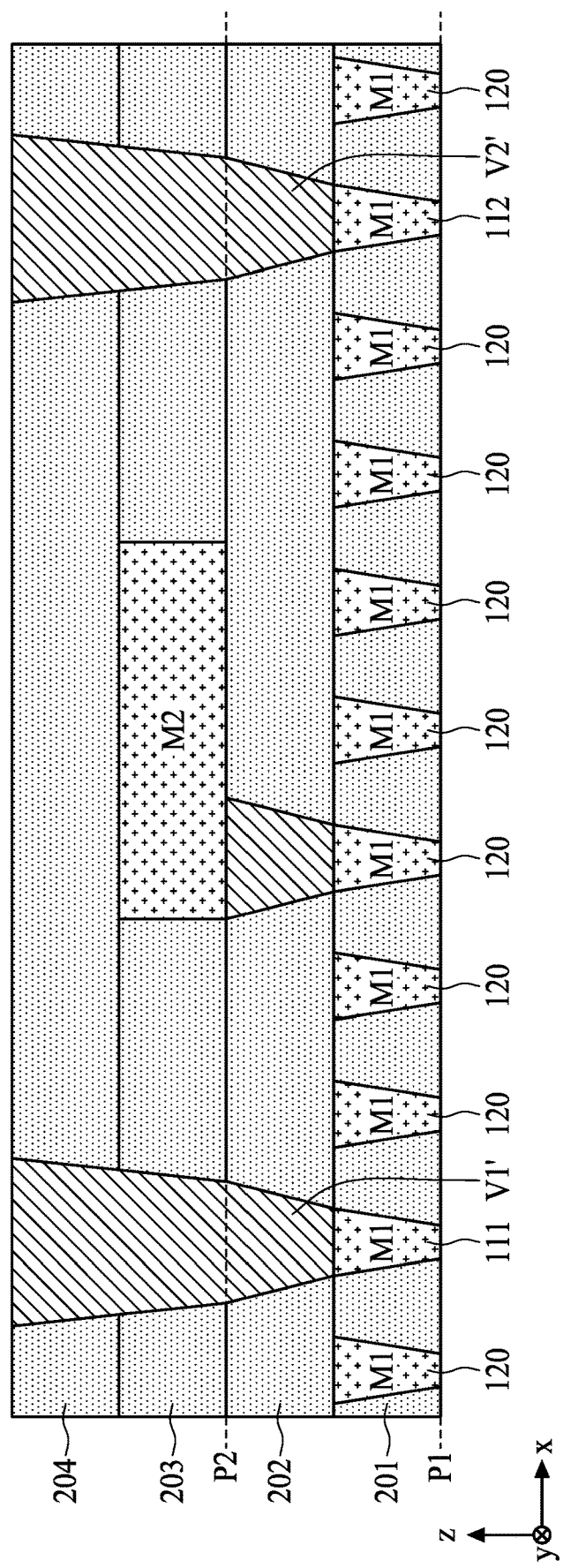
Figure 2Q:
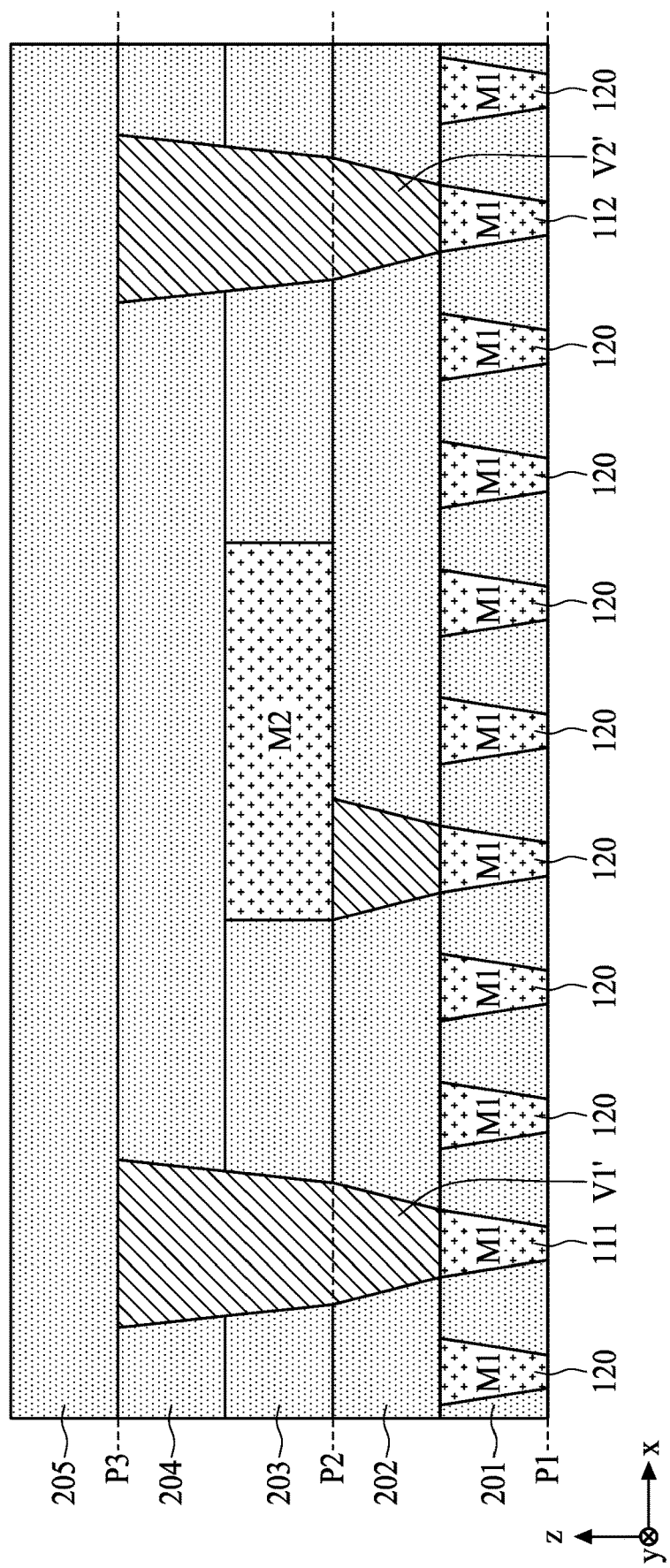
Figure 2R:
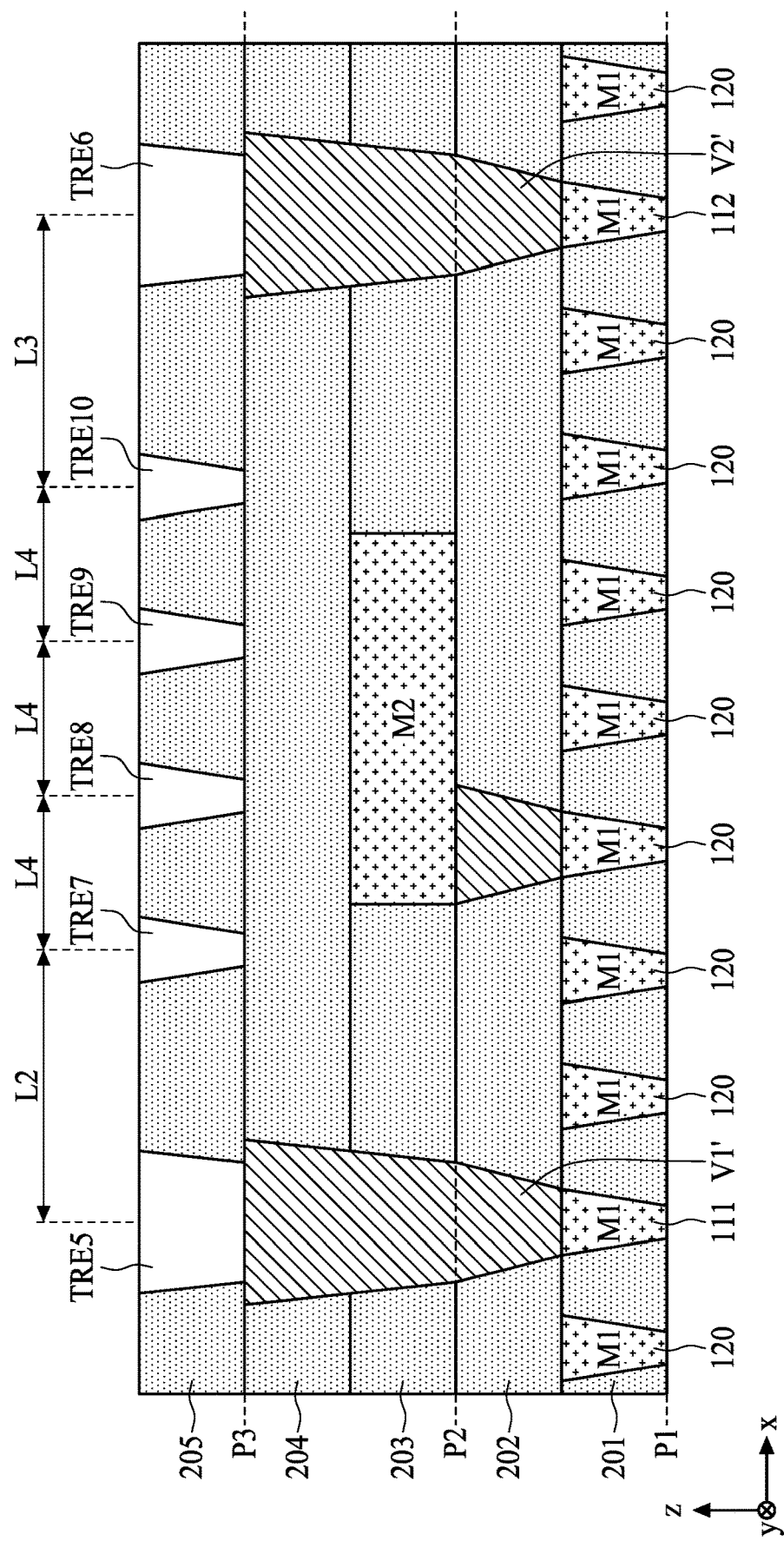
Figure 2S:
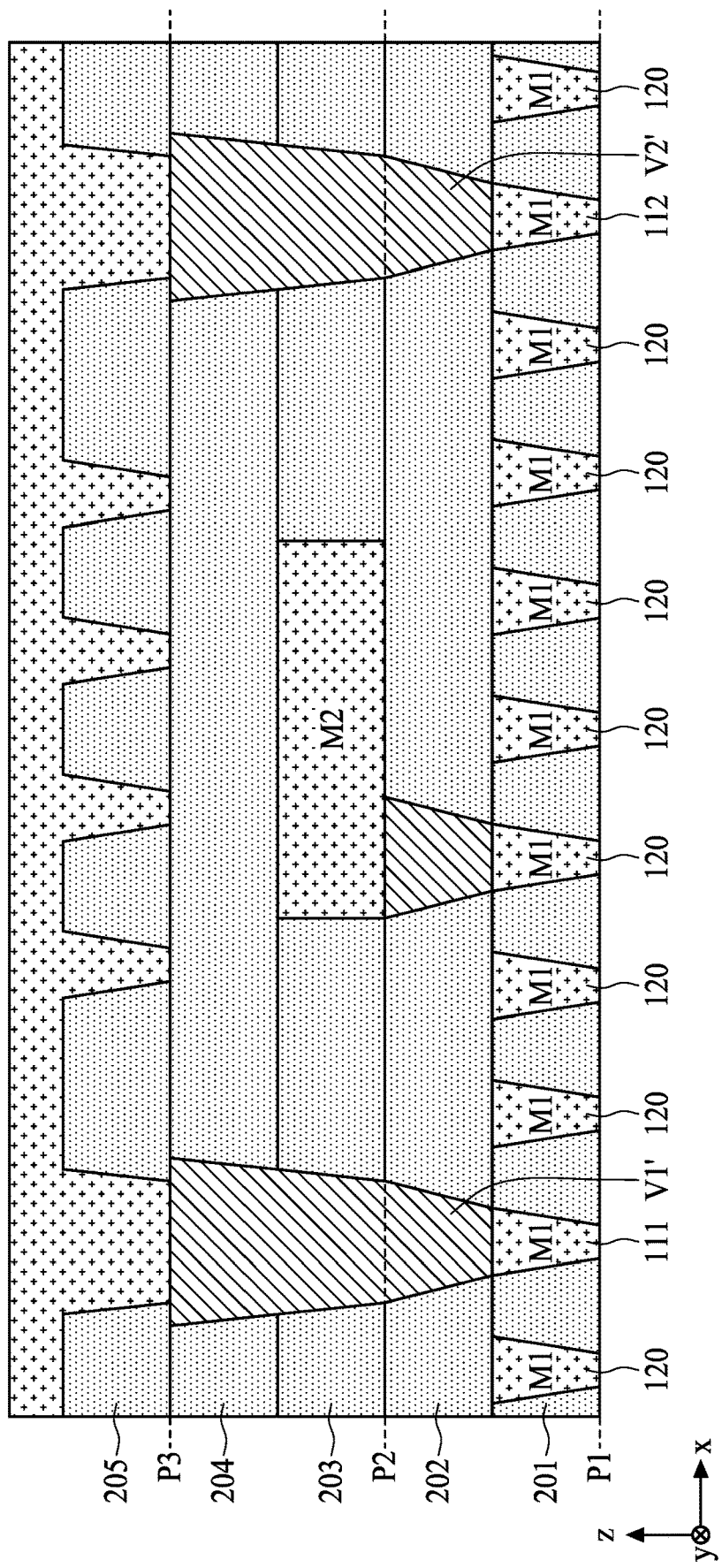
Figure 2T:
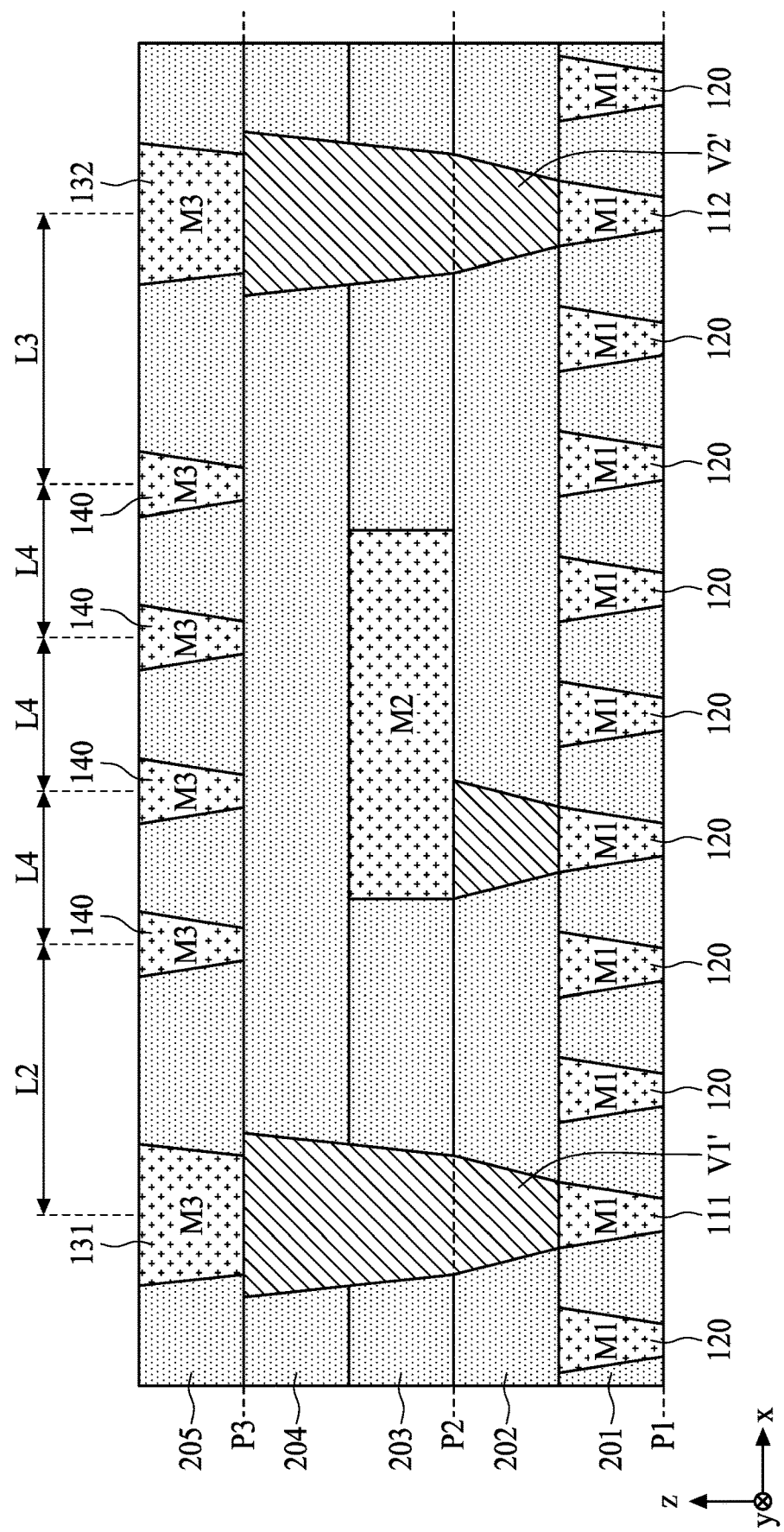

FIGS. 2A to 2T are cross-sectional views illustrating a method of manufacturing the semiconductor device 20 in accordance with an embodiment of the present disclosure. In FIG. 2A, a dielectric layer 201 is formed on a plane P1 on or over a substrate (not shown). In FIG. 2B, a photolithography operation is executed to generate trenches for deposing metal as metal1. In FIG. 2C, a conductive material is filled in the trenches generated in the FIG. 2B. In FIG. 2D, a chemical-mechanical polishing (CMP) operation is executed to remove the redundant conductive material to form the metal strips 111, 112 and 120 as metal1. The metal strips 111, 112 and 120 are disposed at equal interval on the plane P1. In other words, the distances between two immediate adjacent metal strips on the plane P1 are consistent. For example, a distance between a central line of the metal strip 111 and a central line of the metal strip 120 immediate adjacent to the metal strip 111 is L1. Moreover, a distance between central lines of two immediate adjacent metal strips 120 is L1, too.

As mentioned above, by aligning metal strips directed to the voltage sources in the upper layer with metal strips directed to the voltage source in the lower layer, the contact vias formed between can reduce the high resistance of the contact vias with different designs. In FIG. 2E, a dielectric layer 202 is formed on the dielectric layer 201. In FIG. 2F, a photolithography operation is executed to generate trenches for deposing contact vias. More specifically, a trench TRE1 is generated over the metal strip 111 for deposing contact via, and a trench TRE2 is generated over the metal strip 112 for deposing contact via. In addition, there can be other trenches generated over the metal strip 120 based on the requirement of design.

In FIG. 2G, a conductive material is filled in the trenches generated in FIG. 2F. In FIG. 2H, a CMP operation is executed to remove the redundant conductive material to form the contact vias. For example, contact vias V1 and V2 are formed over the metal strips 111 and 112, respectively. Those skilled in the art should readily understand that the contact vias V1 and V2 respectively connecting to the metal strips 111 and 112 are considered as VIA1.

In FIG. 2I, a dielectric layer 203 is formed on a plane P2, wherein the plane P2 and a top of the dielectric layer 202 are coplanar. In FIG. 2J, a photolithography operation is executed to generate trenches for deposing metal as metal2. It should be noted that, in this embodiment, there is no trench generated over the contact vias V1 and V2. Therefore, there would not be metal as metal2 over the contact vias V1 and V2.

In FIG. 2K, a conductive material is filled in the trench generated in FIG. 2J. In FIG. 2L, a CMP operation is executed to remove the redundant conductive material to form the metal as metal2. It can be seen from FIG. 2L, the metal in the layer of metal2 extends in a second direction, for example, the x direction which is orthogonal with the extending direction (i.e., the y direction) of the metal strips 111, 112 and 120. In FIG. 2M, a dielectric layer 204 is formed on the dielectric layer 203.

In FIG. 2N, a photolithography operation is executed to generate trenches for contact vias. For example, a trench TRE3 is generated over the contact via V1 for deposing a contact via, and a trench TRE4 is generated over the contact via V2 for deposing a contact via. Since the trench TRE3 punctures the dielectric layers 203 and 204 in one photolithography operation, a top cross-sectional area of the trench TRE3 is bigger than that of a trench puncturing only one layer due to the longer etching time period. Likewise, since the trench TRE4 punctures the dielectric layers 203 and 204 in one photolithography operation, a top cross-sectional area of the trench TRE4 is normally bigger than that of a trench puncturing only one layer due to the longer etching time period.

In FIG. 2O, a conductive material is filled in the trenches TRE3 and TRE4 generated in FIG. 2N. In FIG. 2P, a CMP operation is executed to remove the redundant conductive material to form the contact vias V1' and V2' over the metal strips 111 and 112. In FIG. 2Q, a dielectric layer 205 is formed on a plane P3, wherein the plane P3 and the top of the dielectric layer 204 are coplanar.

In FIG. 2R, a photolithography operation is executed with a single mask to form trenches TRE5, TRE6, TRE7, TRE8, TRE9, and TRE10 for deposing the metal strips 131, 132 and 140 as the metal3. Specifically, to align the metal strip 131 with the metal strip 111, and the metal strip 112 with the metal strip 132, the spacing between two immediate adjacent metal strips in the dielectric layer 205 are different. In this embodiment, the distance between a central line of the trench TRE5 and a central line of the trench TRE7 is L2, and the distance between a central line of the trench TRE10 and a central line of the trench TRE6 is L3.

The distance between a central line of the trench TRE7 and a central line of the trench TRE8, the central line of the trench TRE8 and a central line of the trench TRE9, and the central line of the trench TRE9 and a central line of the trench TRE10 are L4, wherein the distance L2 is greater than the distance L4, and the distance L3 is also greater than the distance L4. In this embodiment, the photolithography operation is executed by utilizing an Extreme ultraviolet lithography (EUV) technique, however, it should not be limited by the present disclosure.

In FIG. 2S, a conductive material is filled in the trenches TRE5, TRE6, TRE7, TRE8, TRE9, and TRE10 generated in FIG. 2R. In FIG. 2T, a CMP operation is execute to remove the redundant conductive material to form the metal strips 131, 132 and 140 on the plane P3 as the metal3. Accordingly, a distance between the central line of the metal strip 131 and a central line of the metal strip 140 immediate adjacent to the metal strip 131 is L2. Moreover, a distance between the central line of the metal strip 132 and a central line of the metal strip 140 immediate adjacent to the metal strip 132 is L3. In addition, distances of two immediate adjacent metal strips 140 disposed between the metal strips 131 and 132 are consistent. Specifically, the distances of two immediate adjacent metal strips 140 are L4.

It can be seen form FIG. 2T, the contact via V1' is formed from the top of the metal strip 111 to the plane P3 (more specifically, to the metal strip 131) without a metal (i.e., metal2) as an intermedium. As a result, the resistance of the contact via V1' is reduced due to the absence of a barrier formed between a metal and a contact via. Likewise, the contact via V2' is formed from the top of the metal strip 112 to the plane P3 (more specifically, to the metal strip 132) without a metal (i.e., metal2) as an intermedium. As a result, the resistance of the contact via V2' is reduced due to the absence of a barrier formed between a metal and a contact via. Moreover, as mentioned in FIG. 2N, the cross-sectional areas of the trenches TRE3 and TRE4 are bigger due to the longer etching time period, therefore, the top surfaces of the contact vias V1' and V2' are bigger. Accordingly, the resistance of the contact vias V1' and V2' are reduced.

In addition, the distance L2 is greater than the distance L4, therefore, the width of the metal strip 131 can be designed to be wider than the width of the metal strip 140. Accordingly, the resistance of the metal strip 131 is smaller than the resistance of the metal strip 140. With such configurations, when the metal strips 111 and 131 are directed to the voltage source VDD, the increase of the IR drop can be effectively reduced. Likewise, when the metal strips 112 and 132 are directed to the voltage source VSS, the increase of the IR drop can be effectively reduced.

Figure 3:
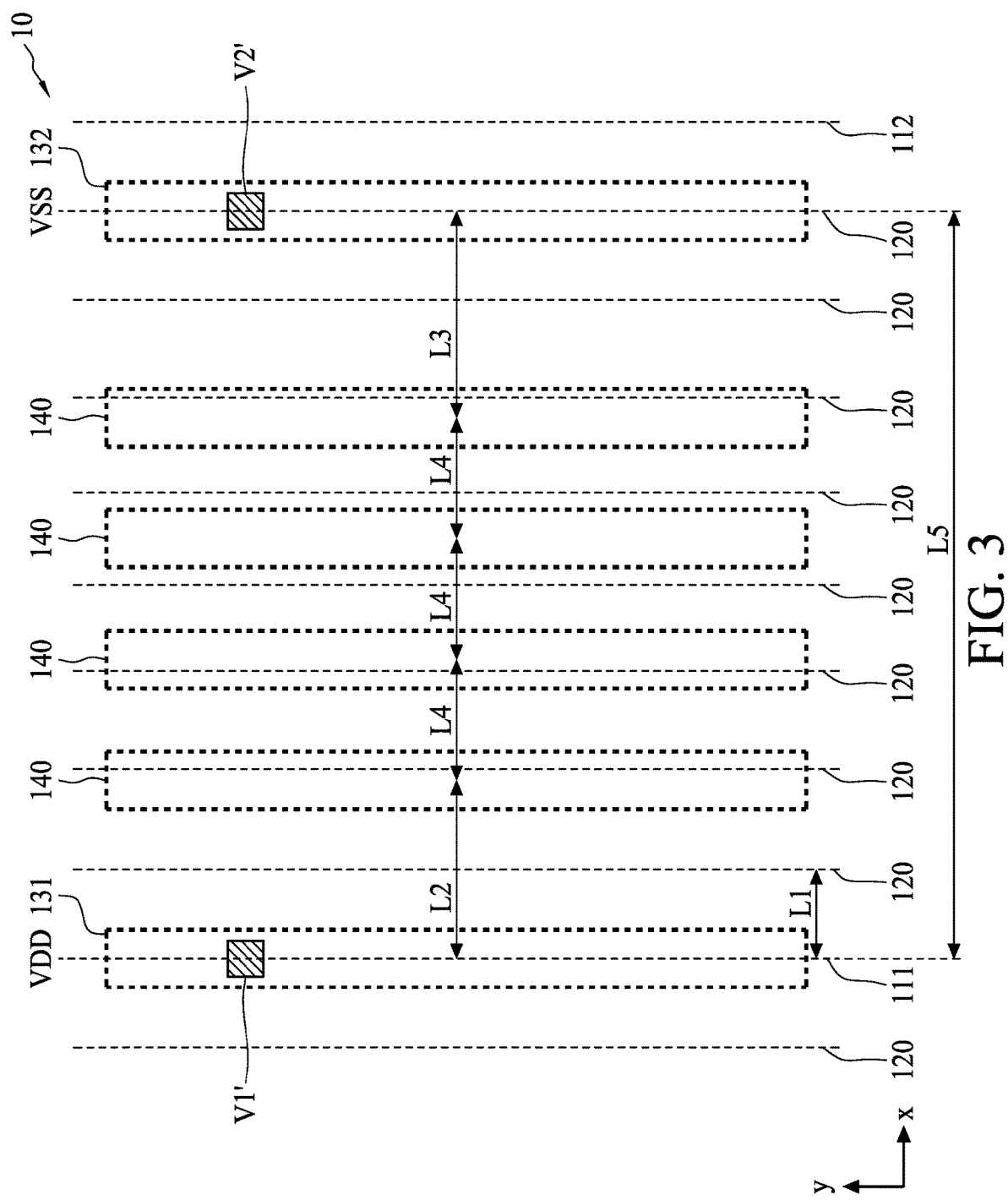
FIG. 3 is a top-view diagram illustrating a semiconductor device in accordance with the embodiments of FIGS. 2A to 2T.

To elaborate the selections of the distance L2 and the distance L3, please refer to FIG. 3, which is a top-view diagram illustrating the semiconductor device 10 in accordance with the embodiments of FIGS. 2A to 2T. Since the central line of the metal strip 131 is aligned with the central line of the metal strip 111 and the central line of the metal strip 132 is aligned with the central line of the metal strip 112, it can be obtained that L2+L3+3*L4=8*L1. For example, assume that the distance L1 is 26 nm, the distance L4 is 30 nm, then the summation L2+L3=8*26−3*30=118 nm. Following by the rule that each of the distance L2 and the distance L3 is greater than the distance L4, the distances L2 and L3 can thus be determined. For example, based on the requirements of design, the distance L2 is determined to be 50 nm while the distance L3 is determined to be 68 nm. However, the exact values of the distances L2 and L3 are only for illustrative purpose, and it should not be a limitation of the present disclosure.

It should be noted that, in some embodiments, the metal strips 120 are not required to be disposed at equal interval between the metal strips 111 and 112. For example, for the requirements of design, there might be few metal strips 120 absent. Therefore, the equation mentioned above can be rewritten as L2+L3+3*L4=L5, wherein L5 can be regarded as a distance between the central line of the metal strip 111 and the central line of the metal strip 112.

As mentioned in FIG. 2N, the trenches TRE3 and TER4 puncture the dielectric layers 203 and 204 in one photolithography operation, therefore, the top cross sectional areas of the trenches TRE3 and TRE4 are bigger due to the longer etching time period. In other embodiments, the trenches can puncture the dielectric layers 202, 203 and 204 in one photolithography operation to achieve the same goal.

Figure 4A:
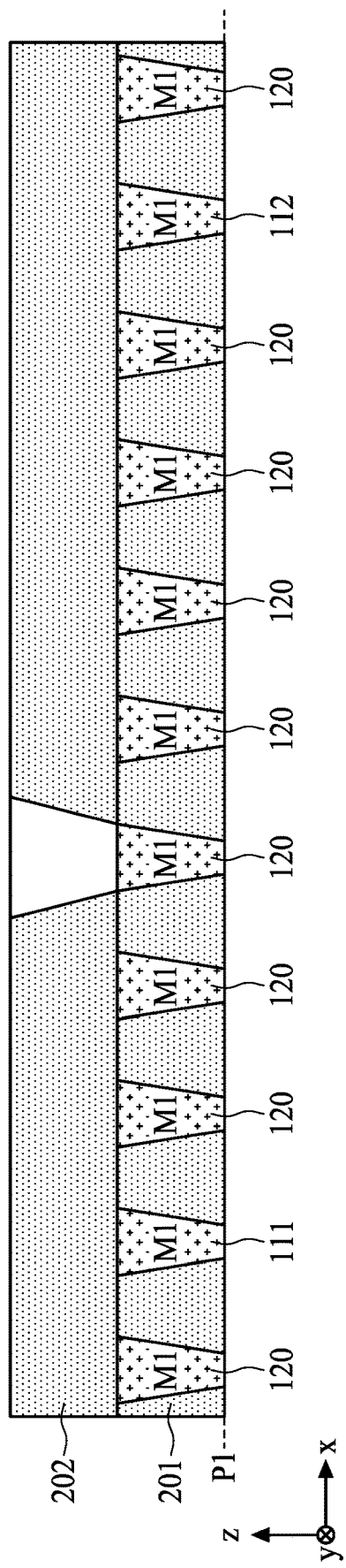
FIGS. 4A to 4K are cross-sectional views illustrating a part of a process of manufacturing a semiconductor device based on the embodiments of FIGS. 2A to 2B.
Figure 4B:
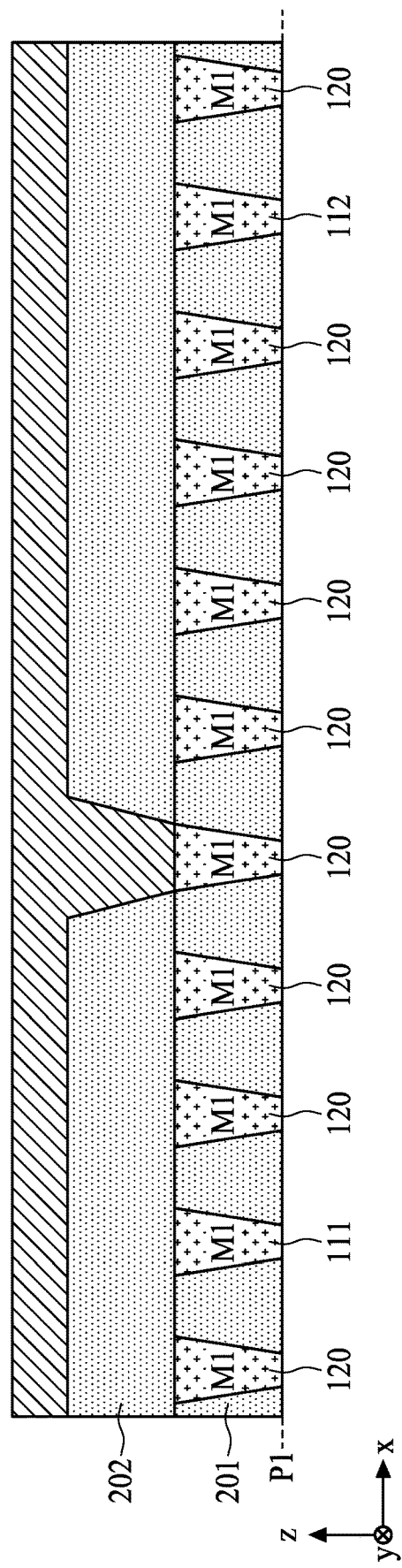
Figure 4C:
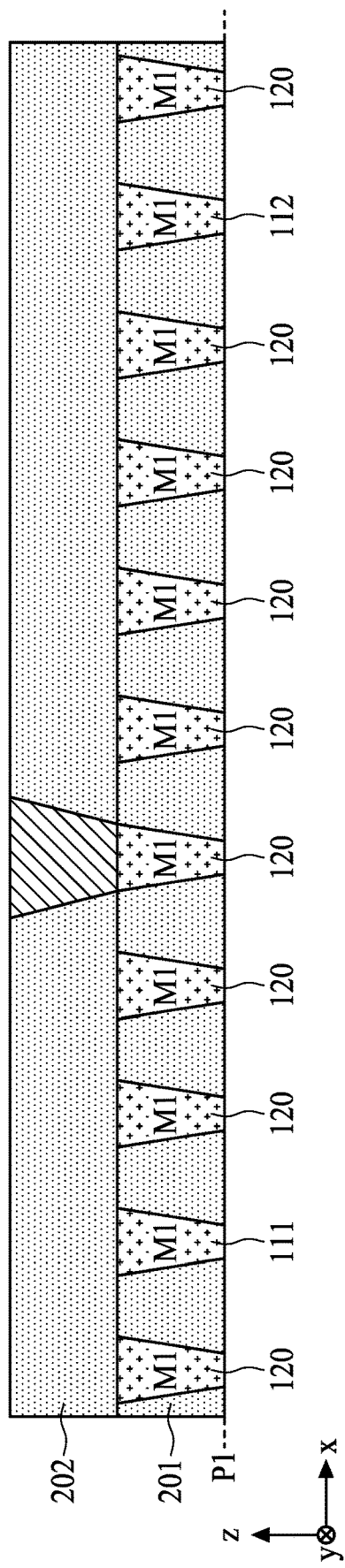
Figure 4D:
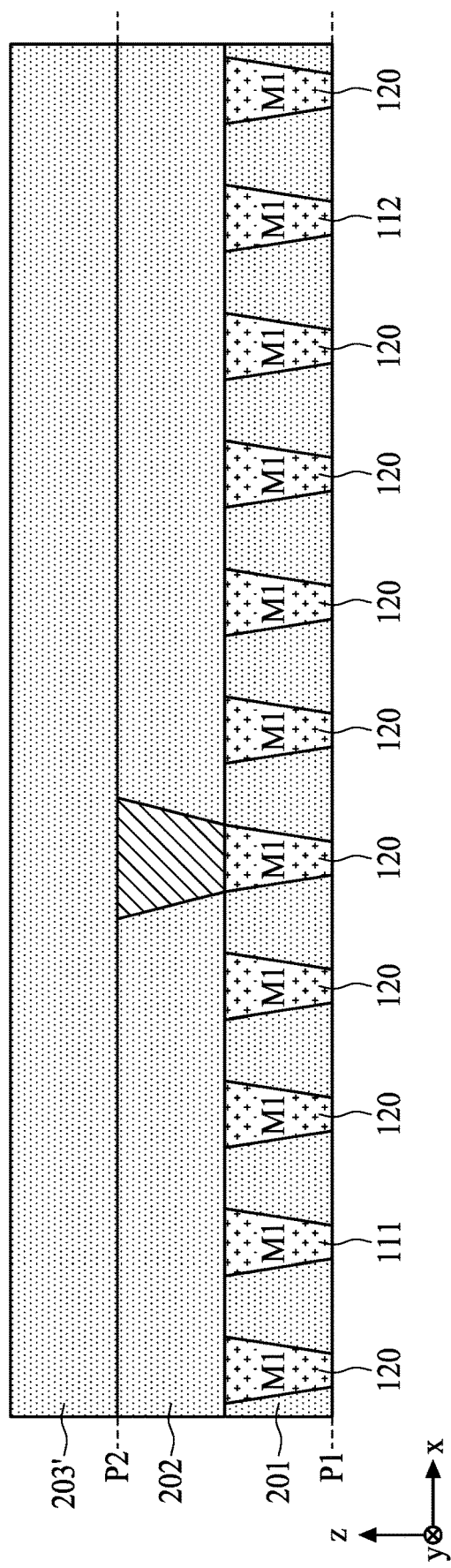
Figure 4E:
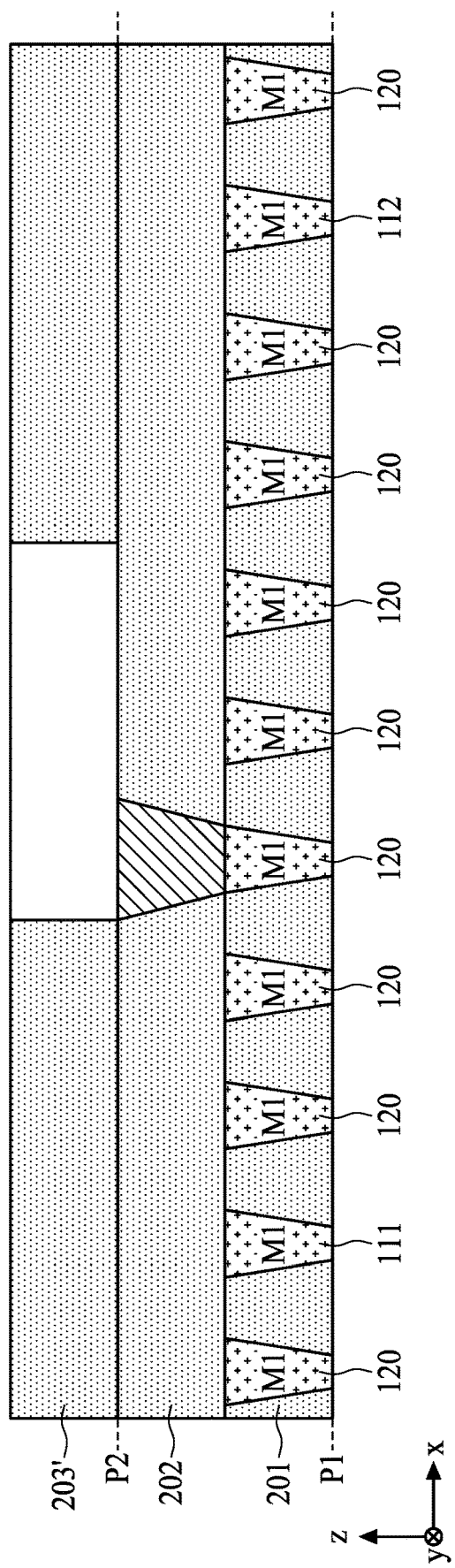

FIGS. 4A to 4K are cross-sectional views illustrating a part of a method of manufacturing the semiconductor device 10 based on the embodiments of FIGS. 2A to 2B. In FIG. 4A, a photolithography operation is executed to generate a trench for deposing a contact via. It can be seen from FIG. 4A, there is no trench generated over the metal strips 111 and 112. In FIG. 4B, a conductive material is filled in the trench generated in FIG. 4A. In FIG. 4C, a CMP operation is executed to remove the redundant conductive material to form a contact via as VIA1. In FIG. 4D, a dielectric layer 203' is formed on the plane P2. In FIG. 4E, a photolithography operation is generated to form a trench for deposing metal as metal2. It should be noted that, in this embodiment, there is no trench generated over the metal strips 111 and 112. Therefore, there would not be metal as metal2 over the metal strips 111 and 112.

Figure 4F:
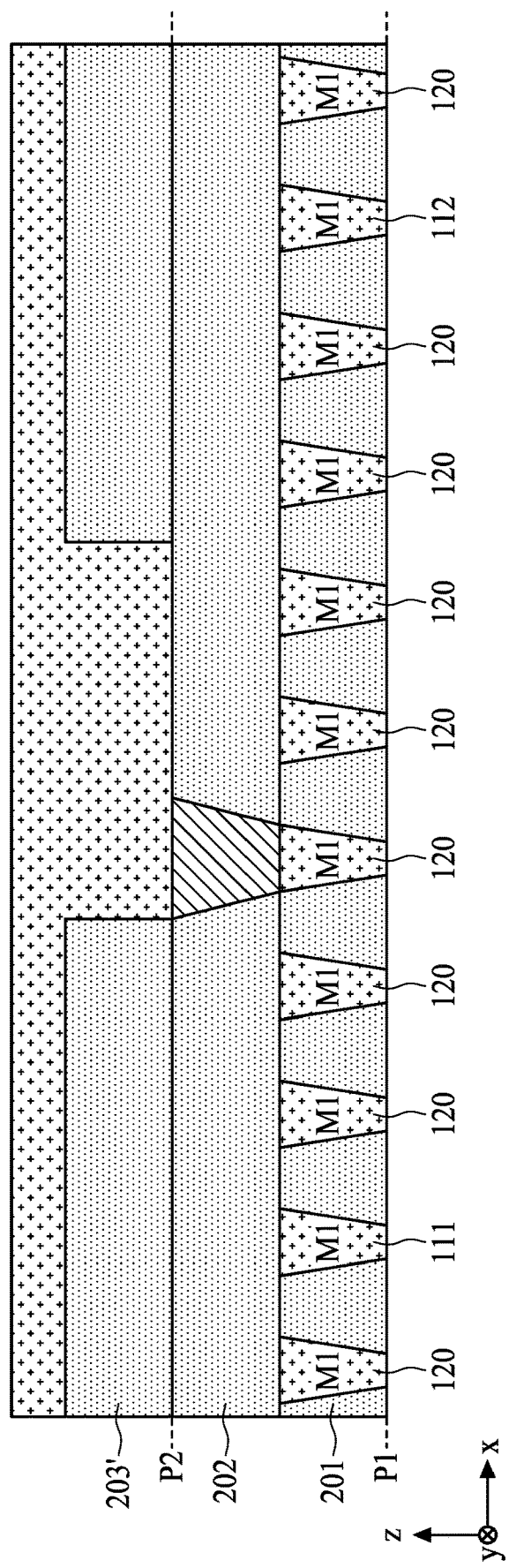
Figure 4G:
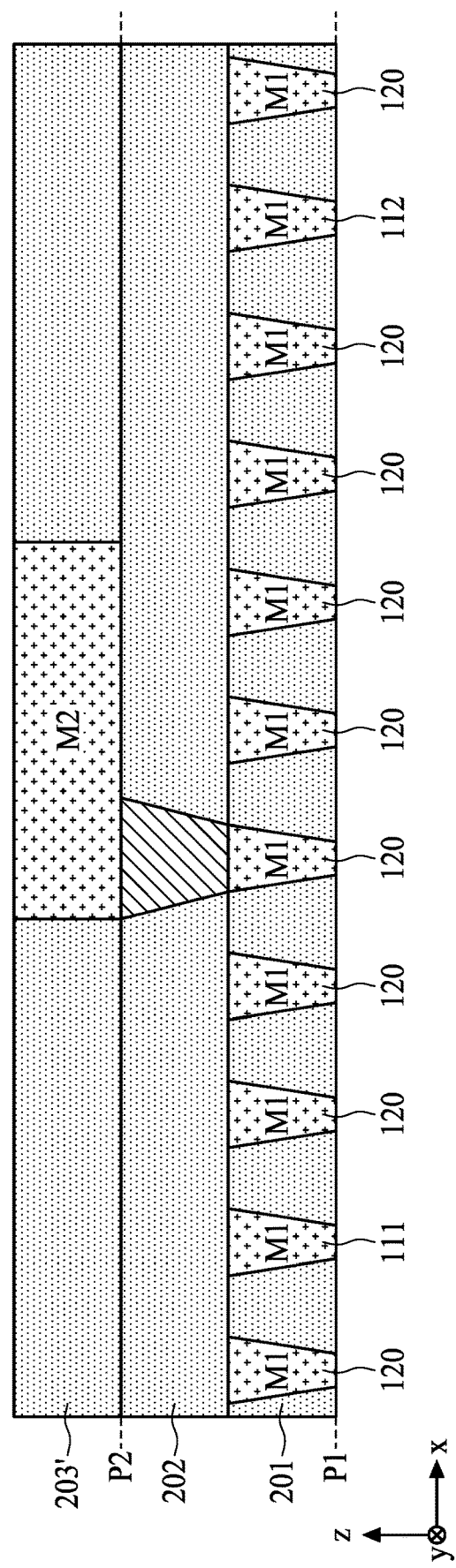
Figure 4H:
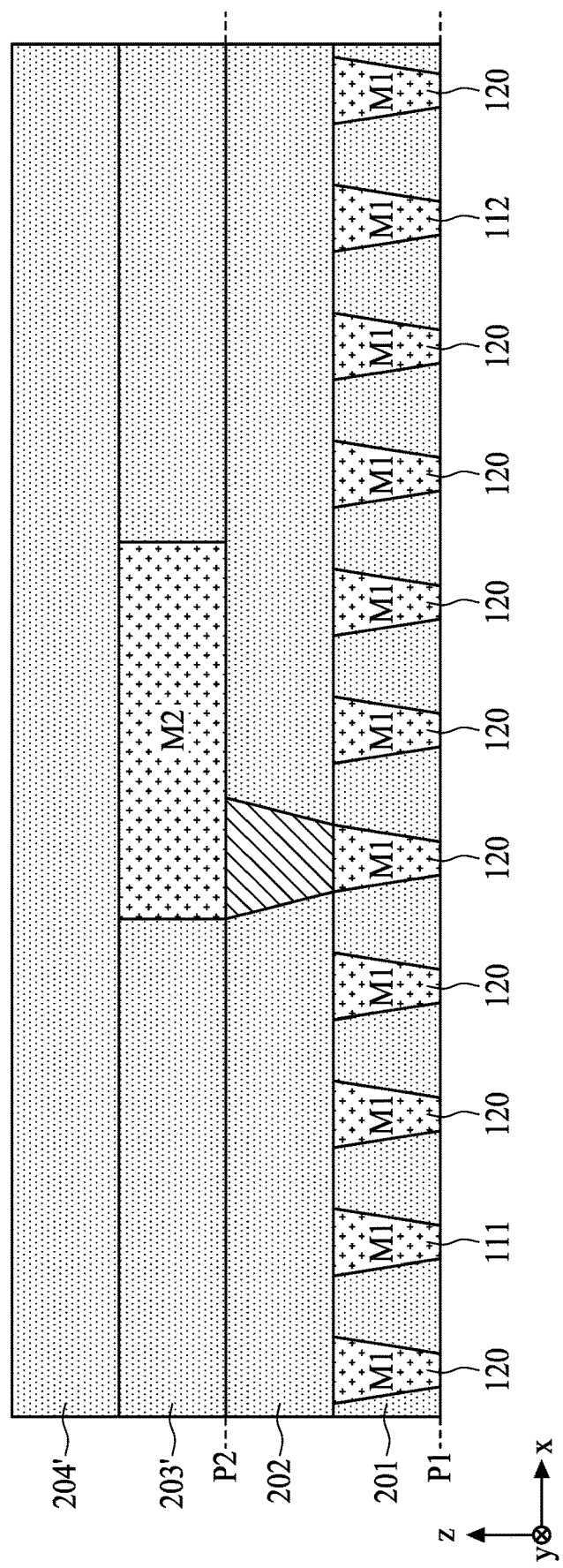

In FIG. 4F, a conductive material is filled in the trench generated in FIG. 4E. In FIG. 4G, a CMP operation is executed to remove the redundant conductive material to form the metal as metal2. It can be seen from FIG. 4G, the metal in the layer of metal2 extends in the x direction which is orthogonal with the extending direction (i.e., the y direction) of the metal strips 111, 112 and 120. In FIG. 4H, a dielectric layer 204' is formed on the dielectric layer 203'.

Figure 4I:
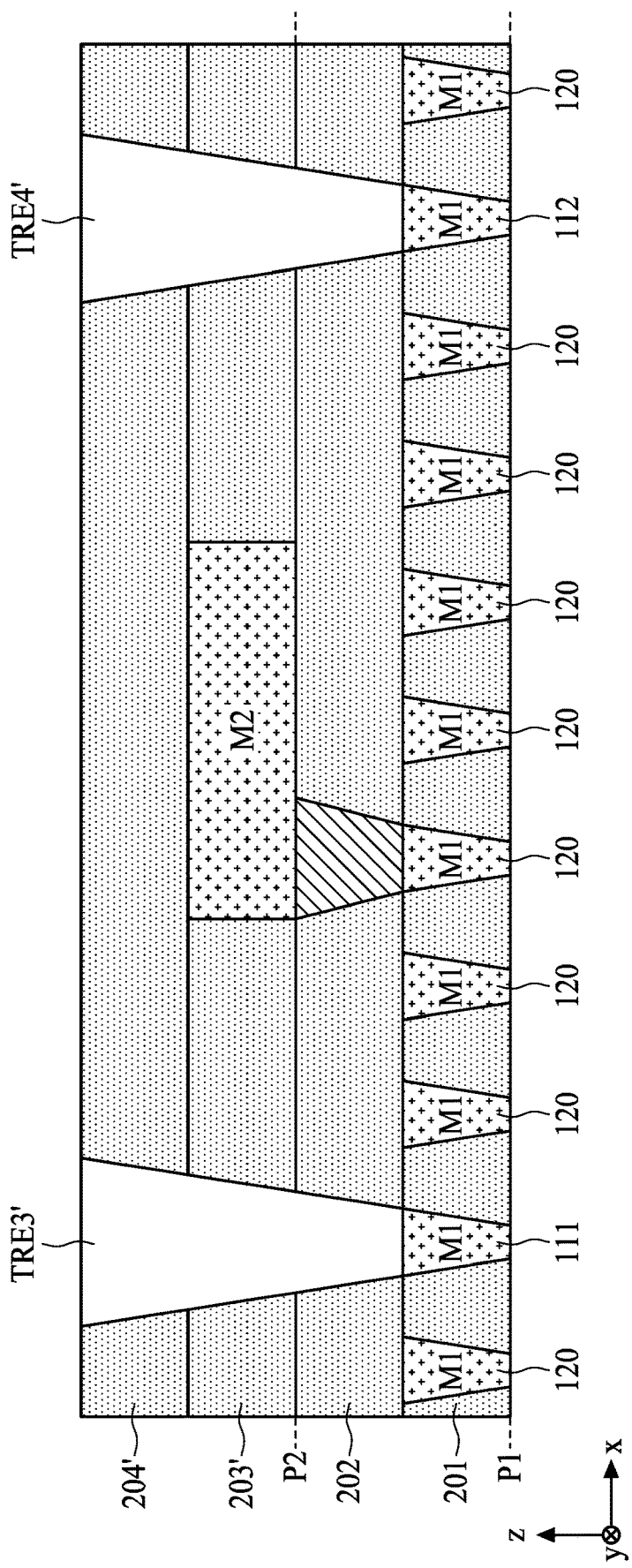

In FIG. 4I, a photolithography operation is executed to form trenches TRE3' and TRE4' for deposing contact vias.

Figure 4J:
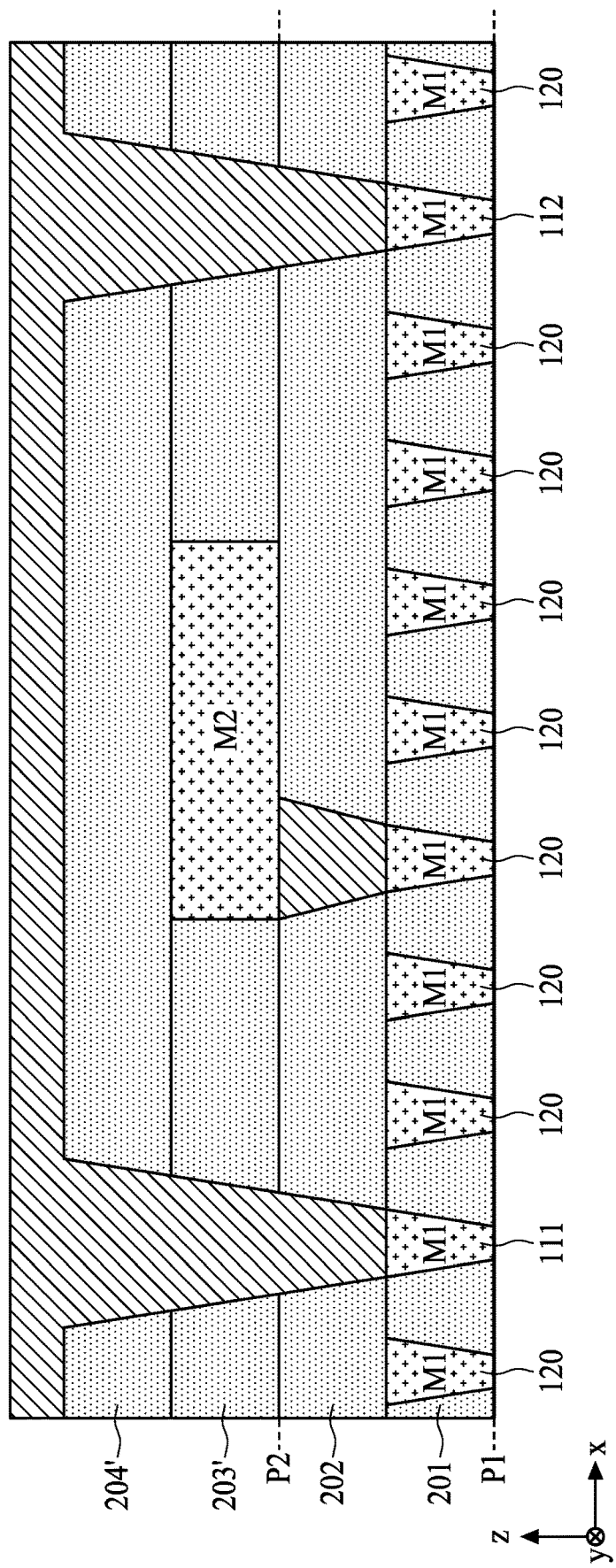

For example, a trench TRE3' is generated over the metal strip 111 for deposing a contact via, and a trench TRE4' is generated over the metal strip 112 for deposing a contact via. Since the trench TRE3' punctures the dielectric layers 202, 203' and 204' in one photolithography operation, a top cross-sectional area of the trench TRE3' is bigger than that of a trench puncturing only one layer due to the longer etching time period. Likewise, since the trench TRE4' punctures the dielectric layers 202, 203' and 204' in one photolithography operation, a top cross-sectional area of the trench TRE4' is bigger than that of a trench puncturing only one layer due to the longer etching time period. In FIG. 4J, a conductive material is filled in the trenches TRE3' and TRE4' generated in FIG. 4I.

Figure 4K:
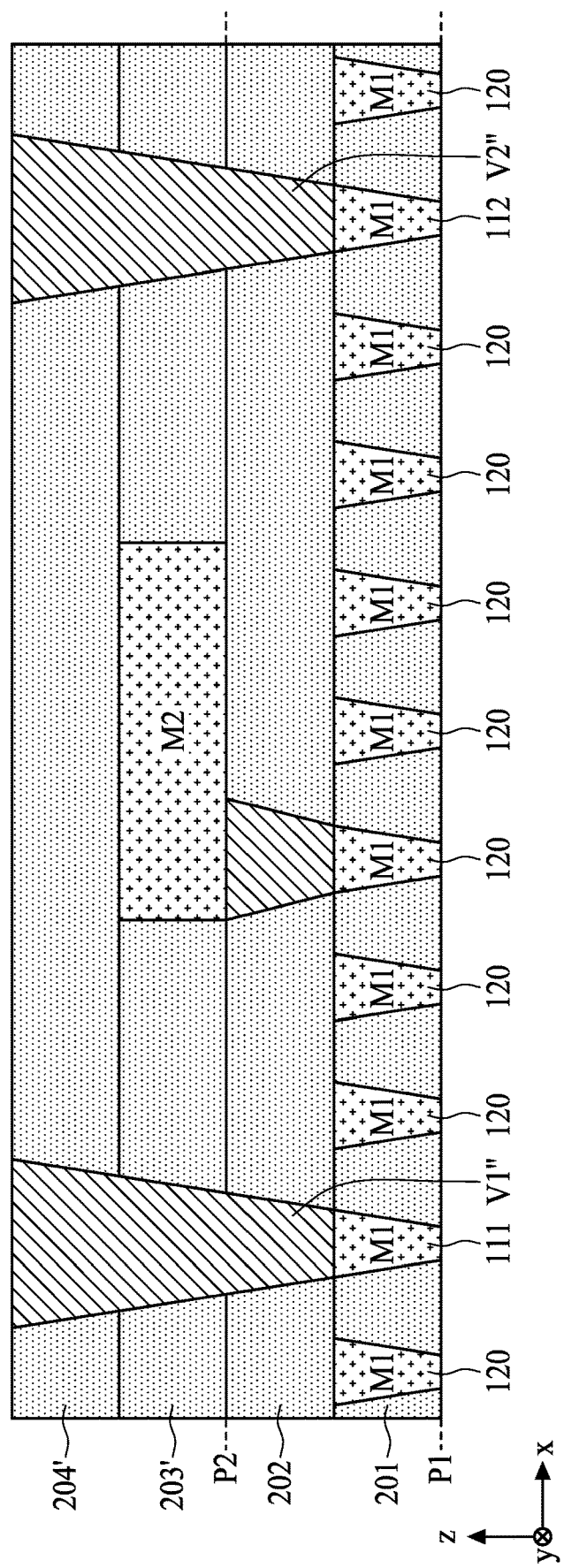

In FIG. 4K, a CMP operation is executed to remove the redundant conductive material to form contact vias V1" and V2" over the metal strips 111 and 112. Comparing to the contact vias V1' and V2', the contact vias V1" and V2" have bigger top cross sectional area due to the longer etching time period. Therefore, the resistance of the contact vias V1" and V2" are lower than that of the contact vias V1' and V2'.

Figure 5A:
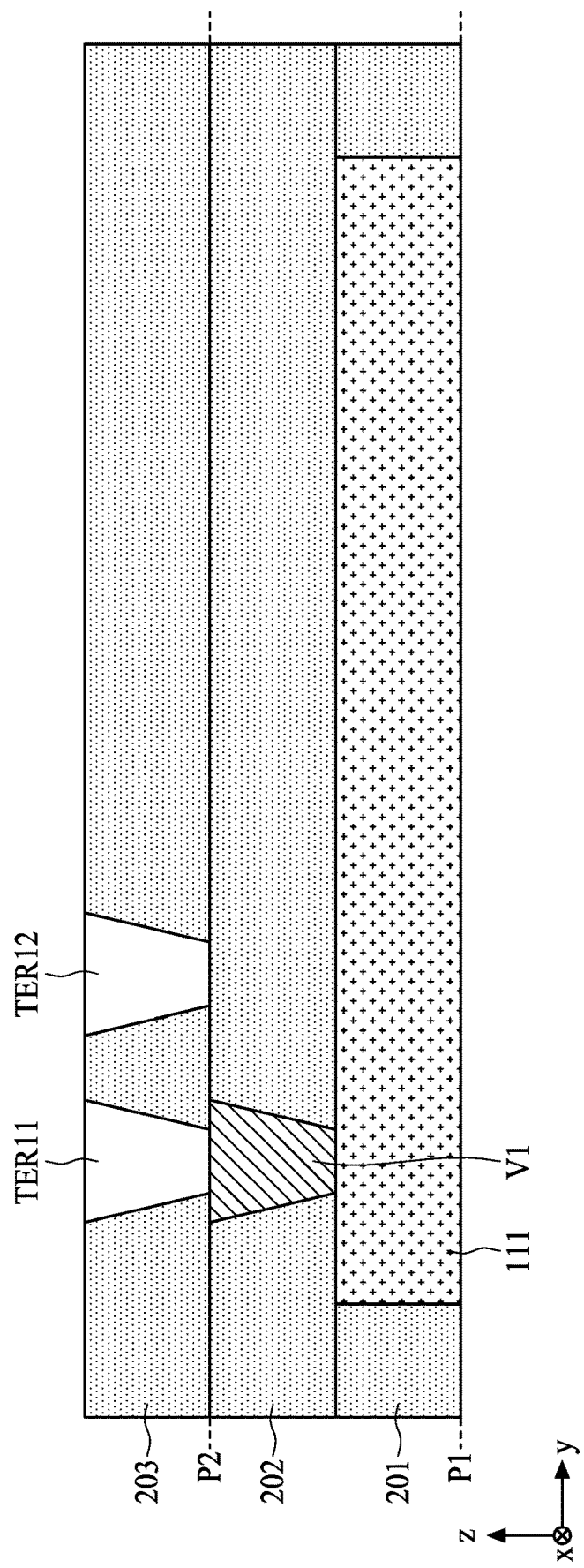
FIGS. 5A to 5K are cross-sectional views illustrating a part of a process of manufacturing a semiconductor device based on the embodiments of the FIGS. 2A and 2F.
Figure 5B:
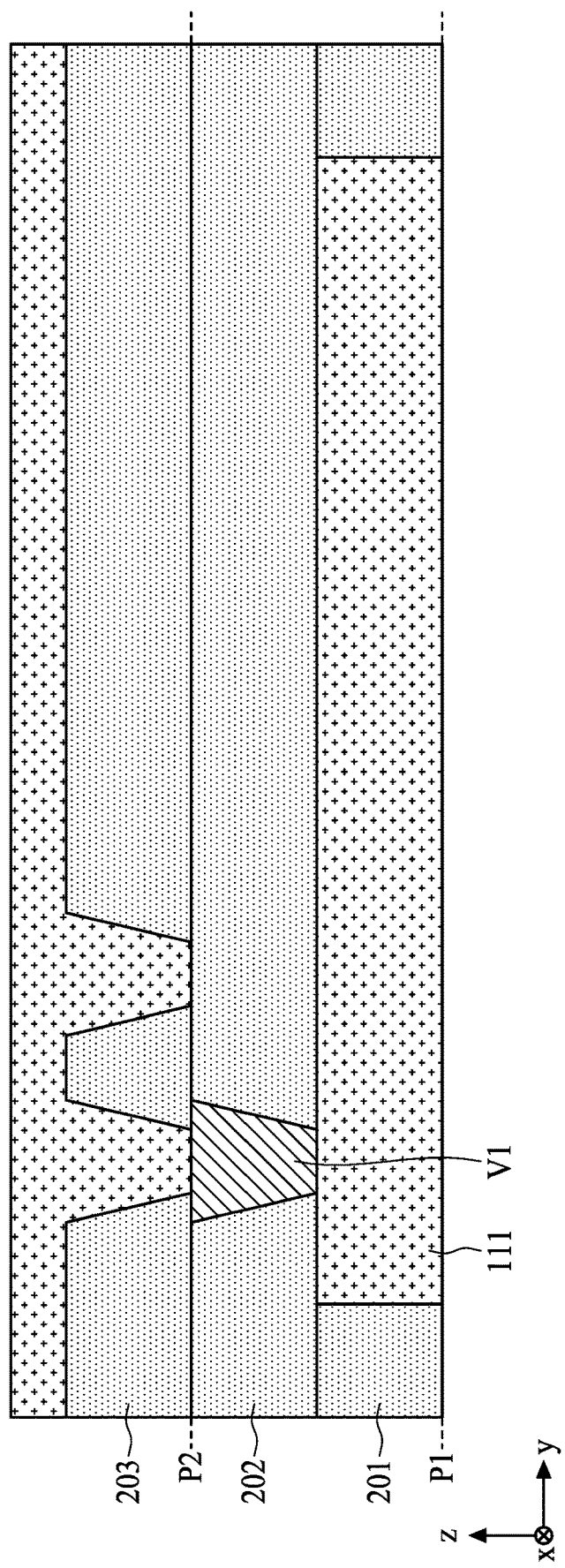
Figure 5C:
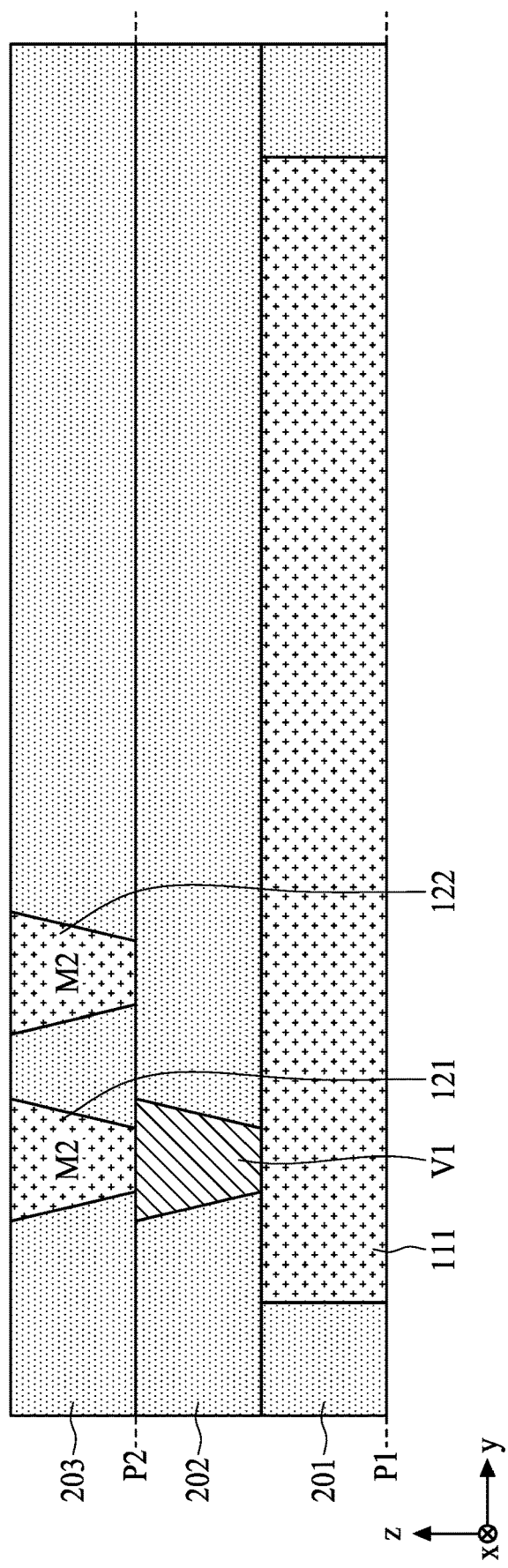
Figure 5D:
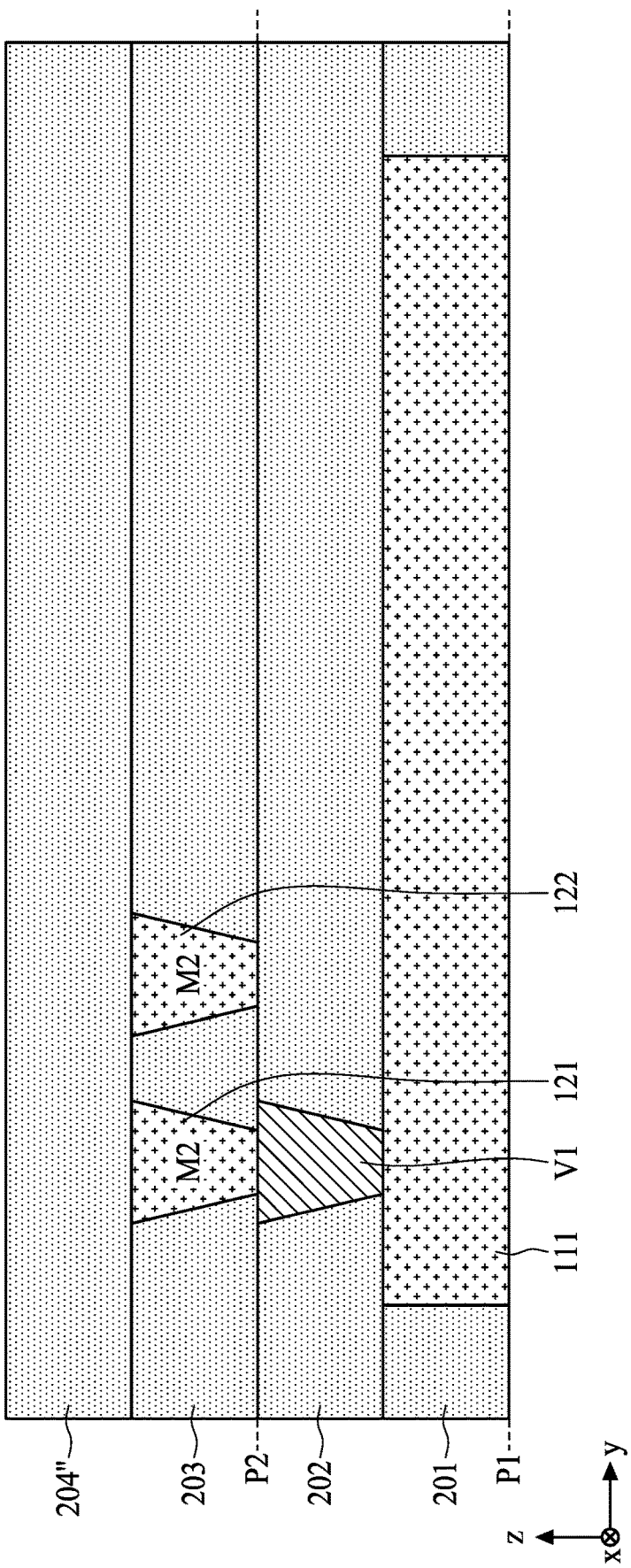

FIGS. 5A to 5K illustrate another design of the contact vias which can effectively reduce the resistance of the contact vias. In FIG. 5A, a photolithography operation is executed upon the dielectric layer 203 to generate trenches for deposing metals. For example, trenches TRE11 and TRE12 are generated over metal strip 111, wherein the trench TRE11 is generated over the contact via V1. In FIG. 5B, a conductive material is filled in the trenches generated in FIG. 5A. In FIG. 5C, a CMP operation is executed to remove the redundant conductive material to form the metal strips 121 and 122 as metal2, wherein the metal strip 121 is immediate adjacent to the metal strip 122. It can be seen from FIG. 5C, the metal strips 121 and 122 extend in the x direction which is orthogonal with the extending direction (i.e., the y direction) of the metal strips 111, 112 and 120. In FIG. 5D, a dielectric layer 204" is formed on the dielectric layer 203.

Figure 5E:
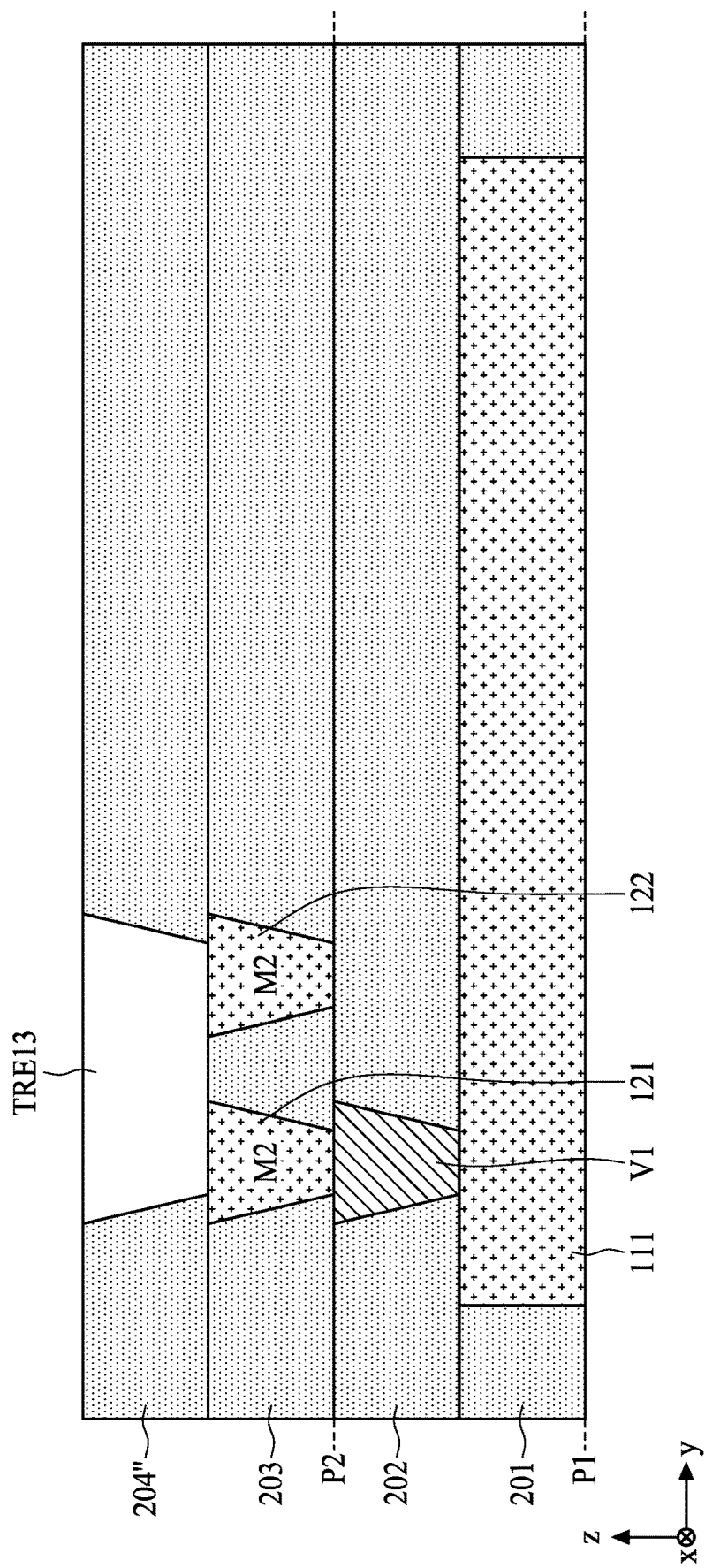
Figure 5F:
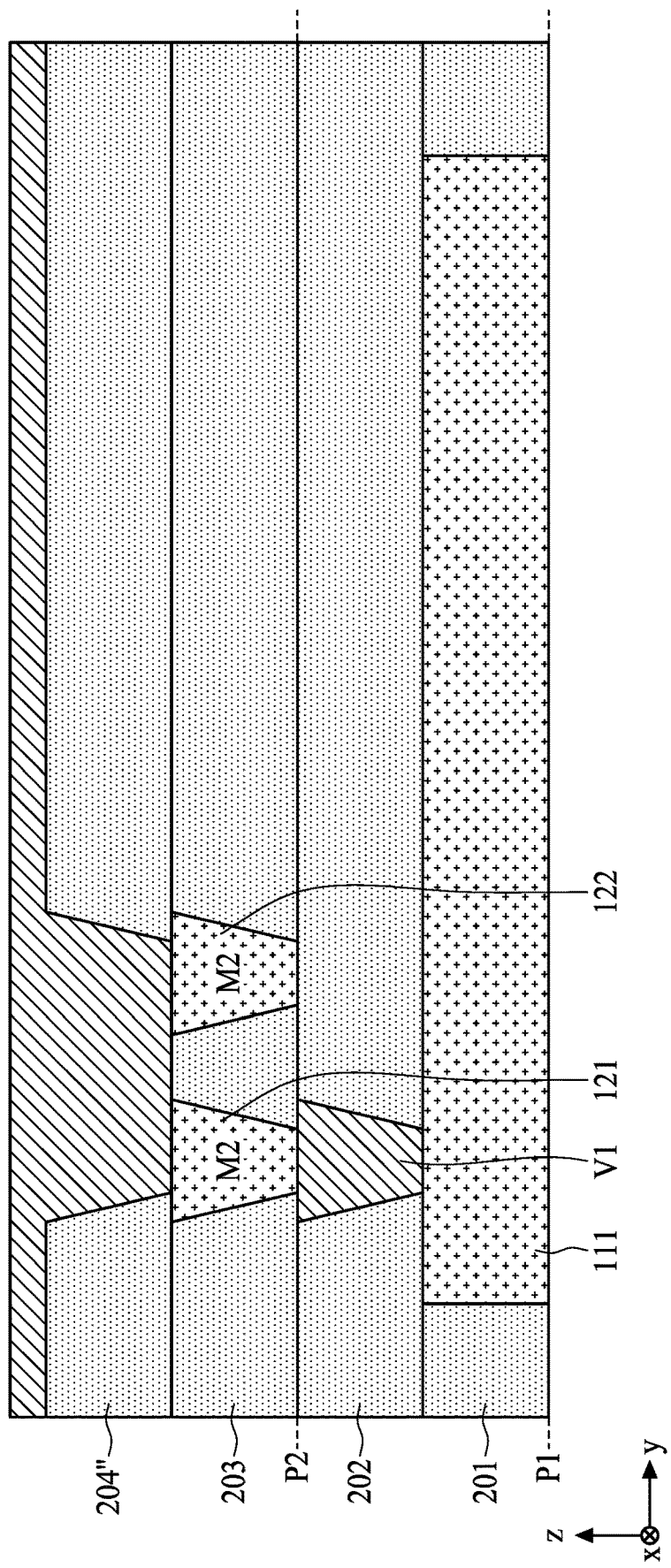
Figure 5G:
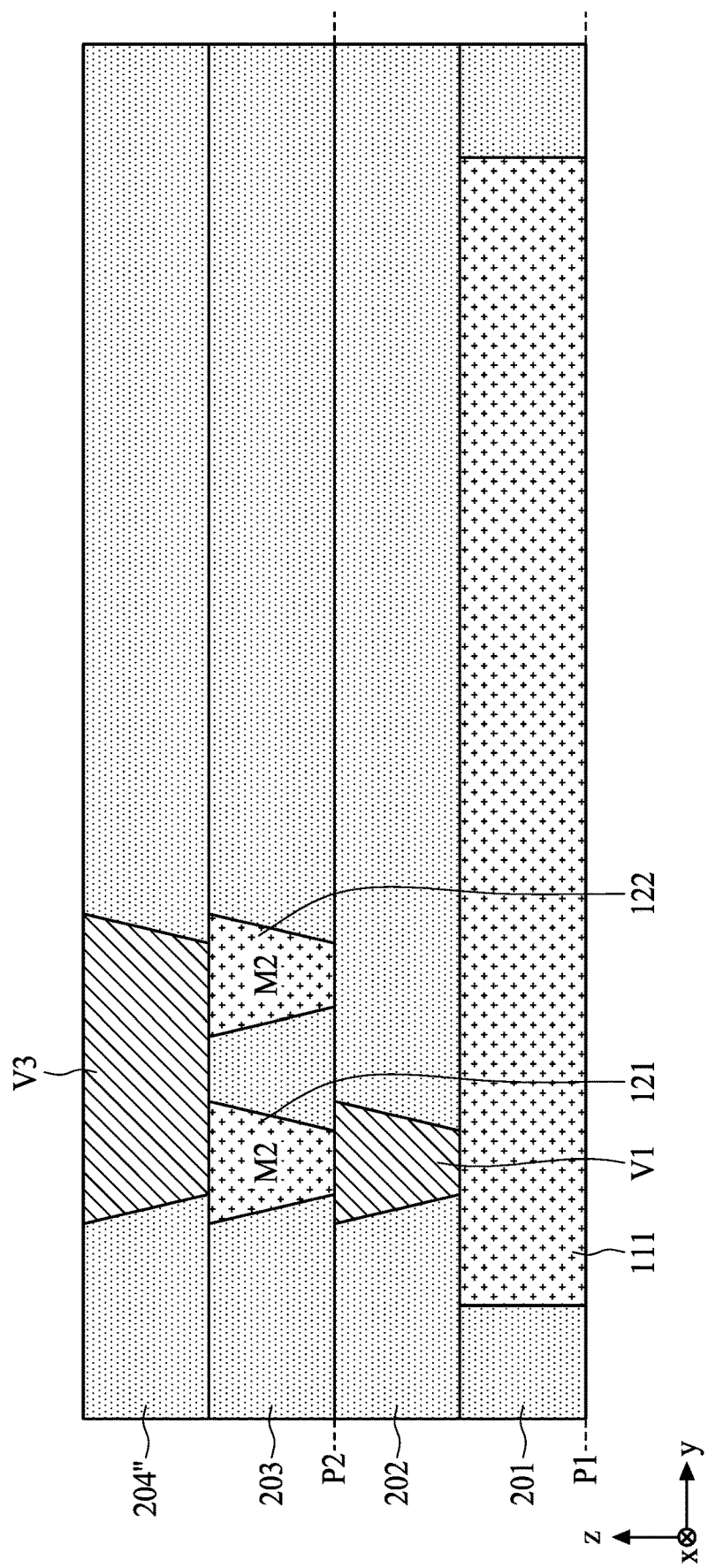

In FIG. 5E, a photolithography operation is executed to generate a trench TRE13 for deposing a contact via, wherein the trench TRE13 is formed on the top of the metal strip 121 and the top of the metal strip 122. In FIG. 5F, a conductive material is filled in the trench TRE1 generated in FIG. 5E. In FIG. 5G, a CMP operation is executed to remove the redundant conductive material to form the contact via V3 over the metal strips 121 and 122. Those skilled in the art should readily understand that the contact via V3 is considered as VIA2.

It can be seen from FIG. 5G, a bottom surface of the contact via V3 and the tops of the metal strips 121 and 122 are coplanar. In other words, the contact via V3 connects to the metal strips 121 and 122 together.

Figure 5H:
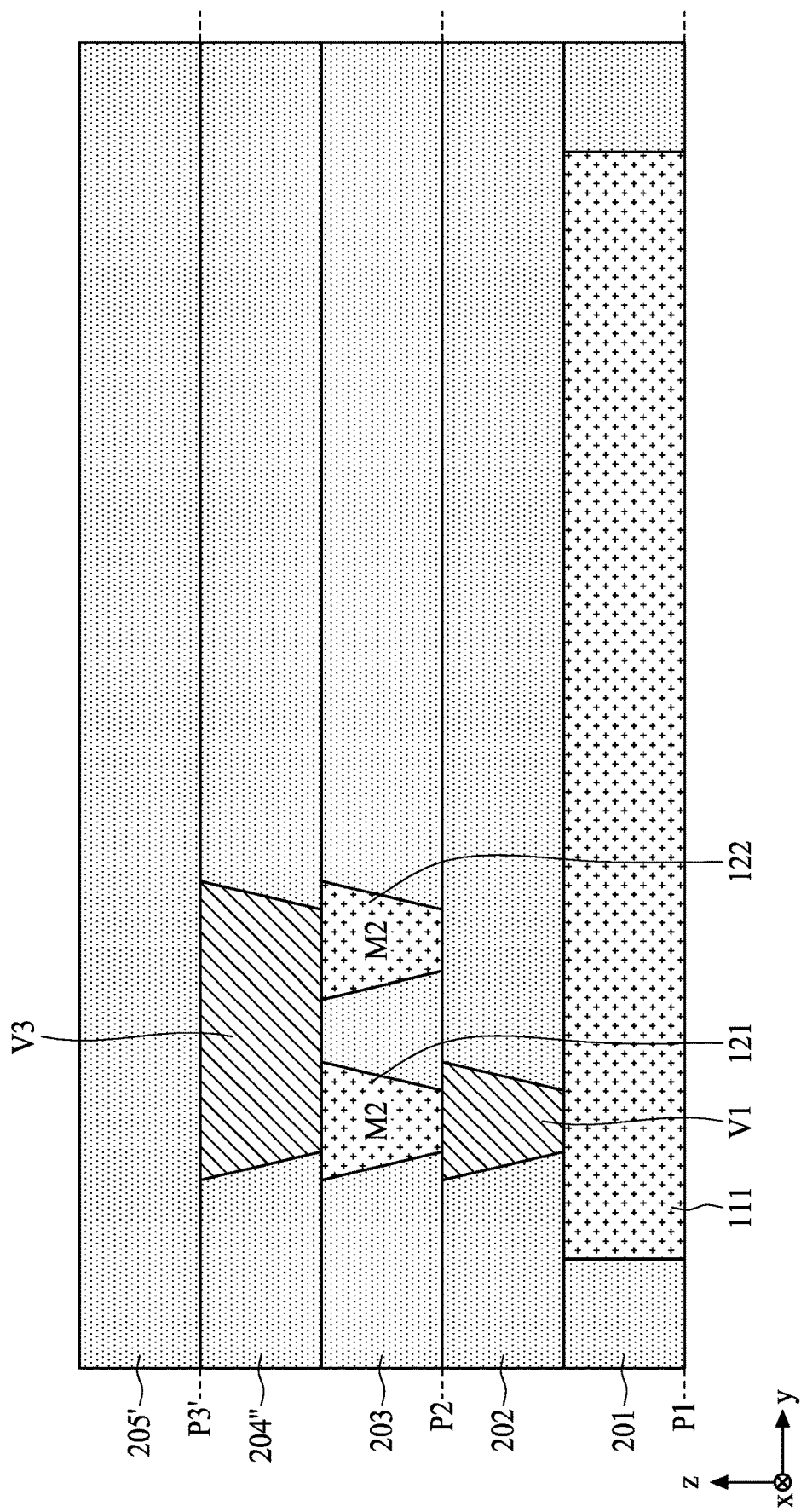
Figure 5I:
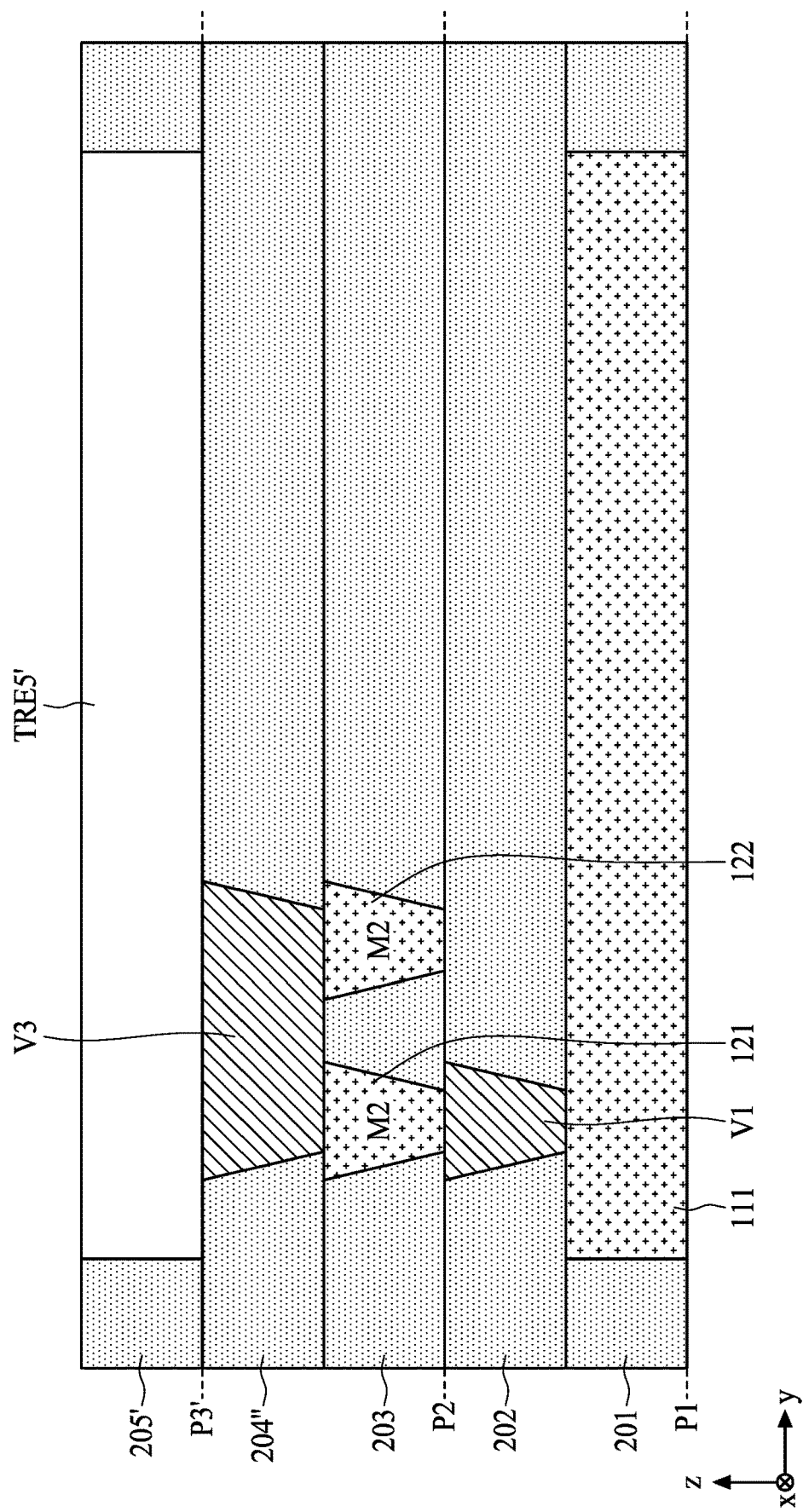
Figure 5J:
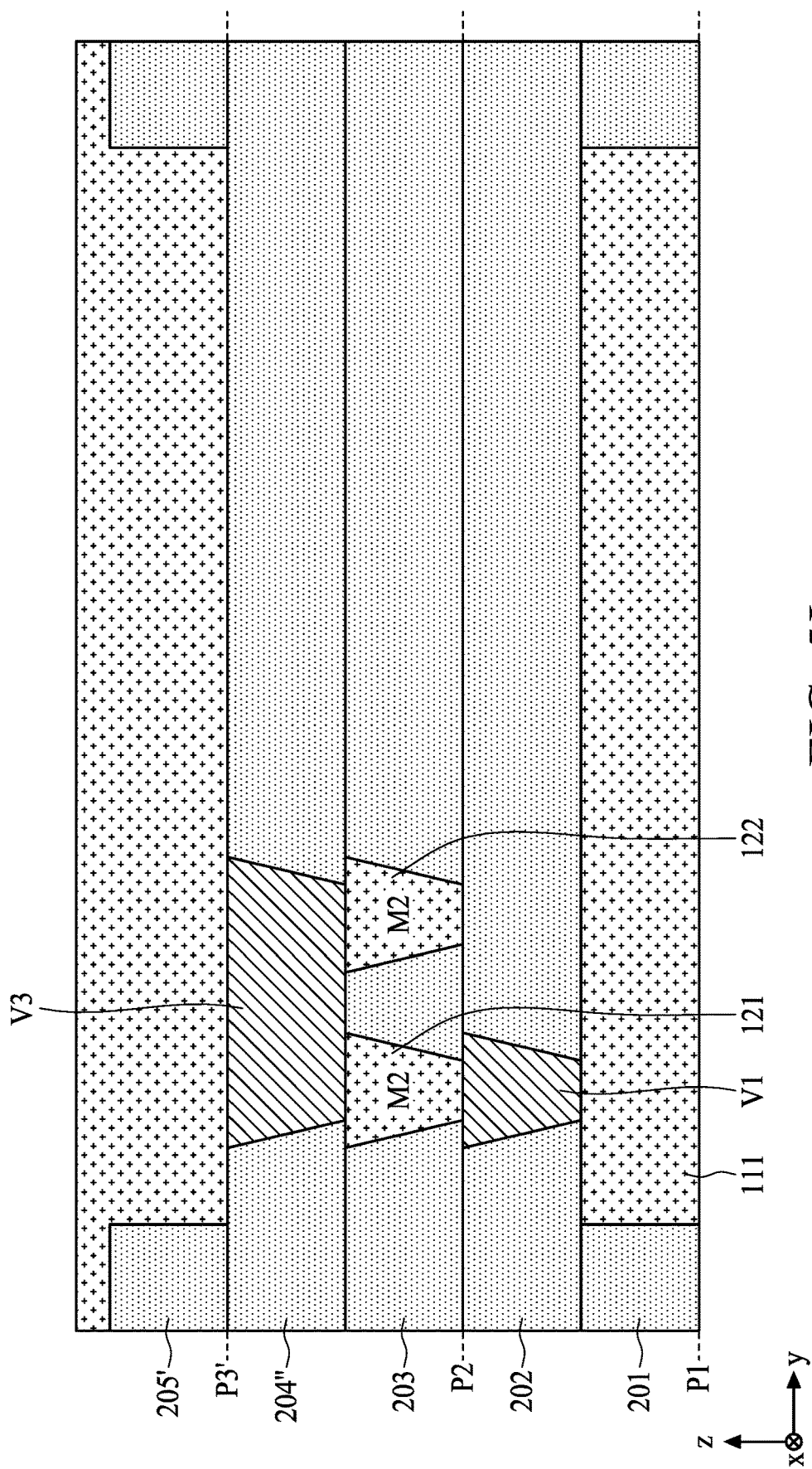
Figure 5K:
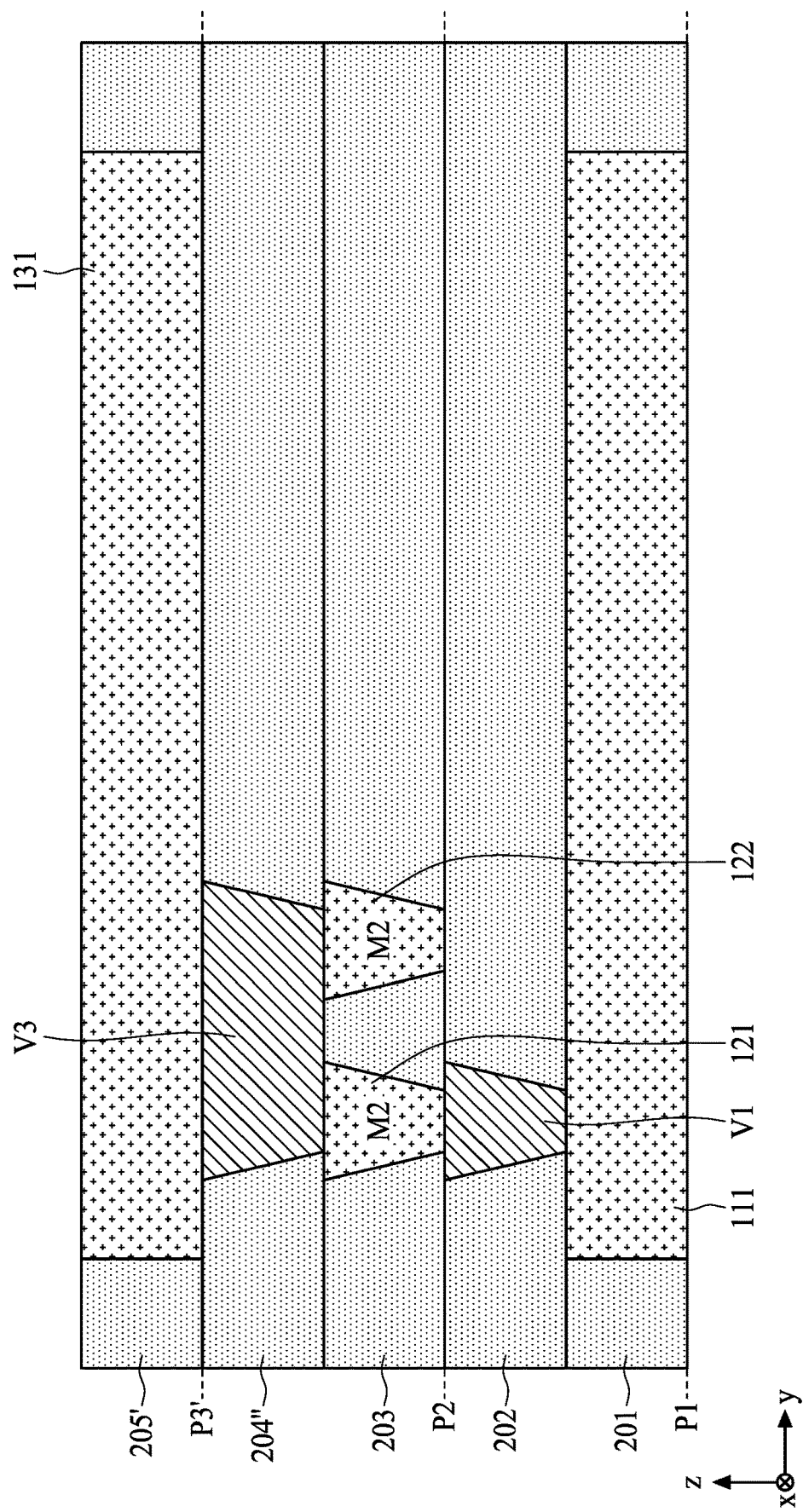

In FIG. 5H, a dielectric layer 205' is formed on a plane P3', wherein the plane P3' and a top surface of the contact via V3 are coplanar. In FIG. 5I, a photolithography operation is executed by utilizing a EUV technique to generate a trench TRE5' for deposing metal as the metal3. In, FIG. 5J, a conductive material is filled in the trench TRE5' generated in FIG. 5I. In FIG. 5K, a CMP operation is executed to remove redundant conductive material to form the metal strip 131 over the metal strip 111.

Figure 6:
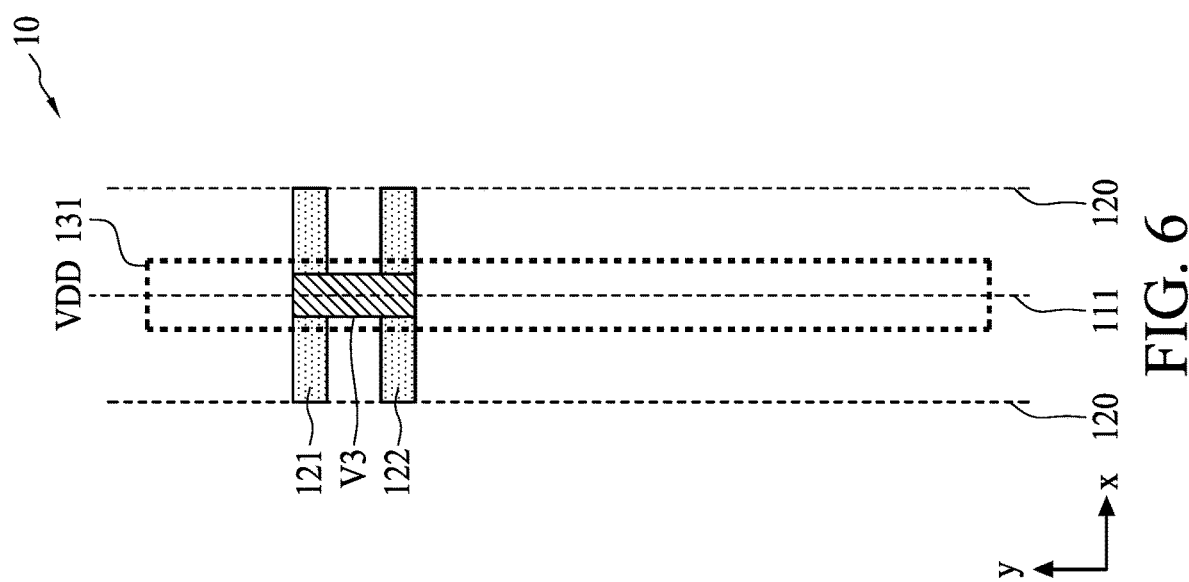
FIG. 6 is a top-view diagram illustrating a semiconductor device in accordance with the embodiments of FIGS. 5A to 5K.

Refer to FIG. 6, which is a top-view diagram illustrating the semiconductor device 10 in accordance with the embodiments of FIGS. 5A to 5K, by generating the trench TRE13 on the tops of the metal strips 121 and 122, the contact via V3 thus includes a bigger top surface which can reduce the resistance of the contact via V3. As a result, when the metal strips 111 and 131 are directed to the voltage source VDD, the increase of the IR drop can be effectively reduced. Likewise, the embodiments of FIGS. 5A to 5K can be adapted for the metal strips 112 and 132 directed to the voltage source VSS. As a result, when the metal strips 112 and 132 are directed to the voltage source VSS, the increase of the IR drop can be effectively reduced.

It should be noted that, in the embodiments of FIGS. 5A to 5K, the trench TRE13 is generated over the tops of metal strips 121 and 122 to obtain the contact via V3 with a bigger top surface connecting to the metal strip 131. However, this is not a limitation of the present disclosure. Those skilled in the art should readily understand that the trench TRE13 can be generated over more than two metal strips, for example, three metal strips in the layer of metal2 to obtain a contact via with a bigger top surface connecting to the metal strip 131. As a result, when the metal strips 111 and 131 are directed to the voltage source VDD, the increase of the IR drop can be effectively reduced.

Figure 7A:
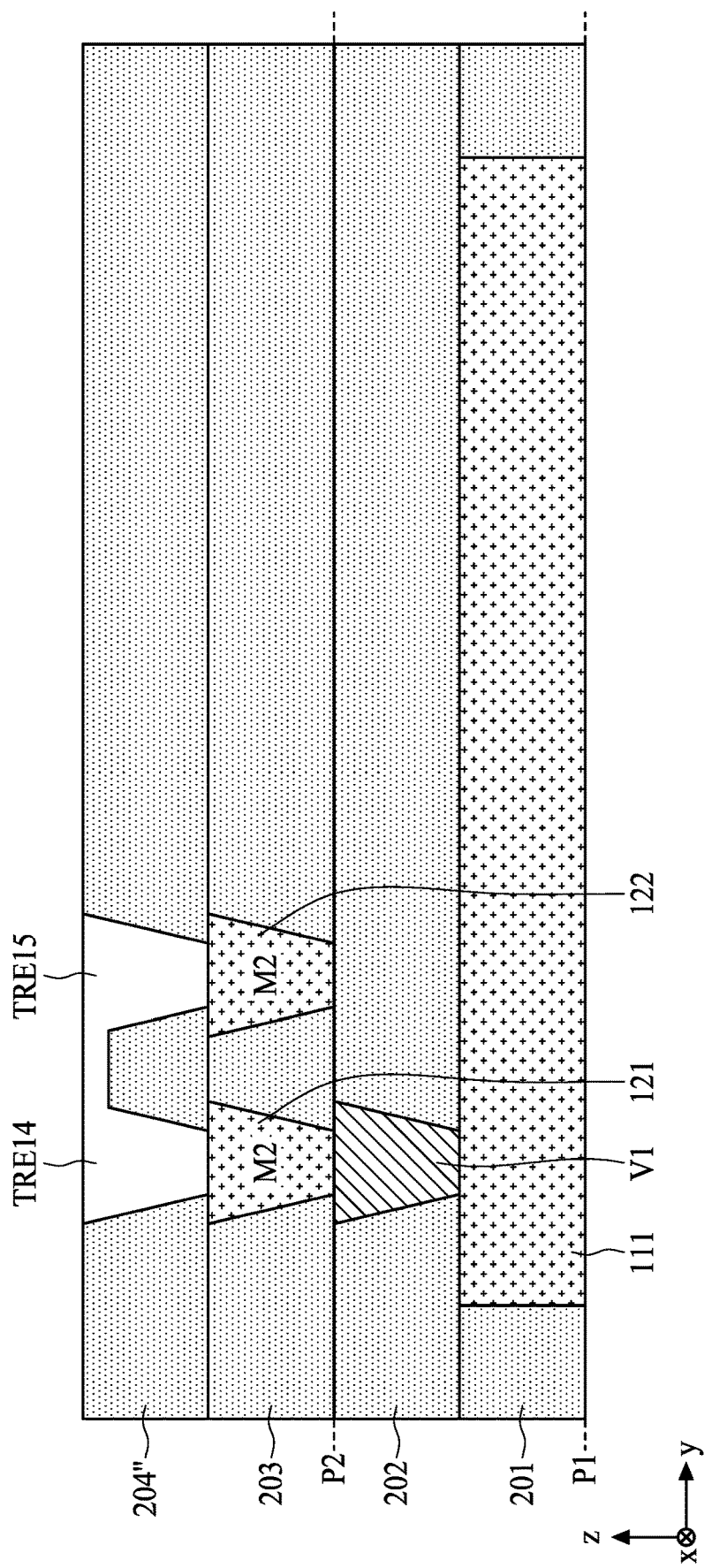
Figure 7B:
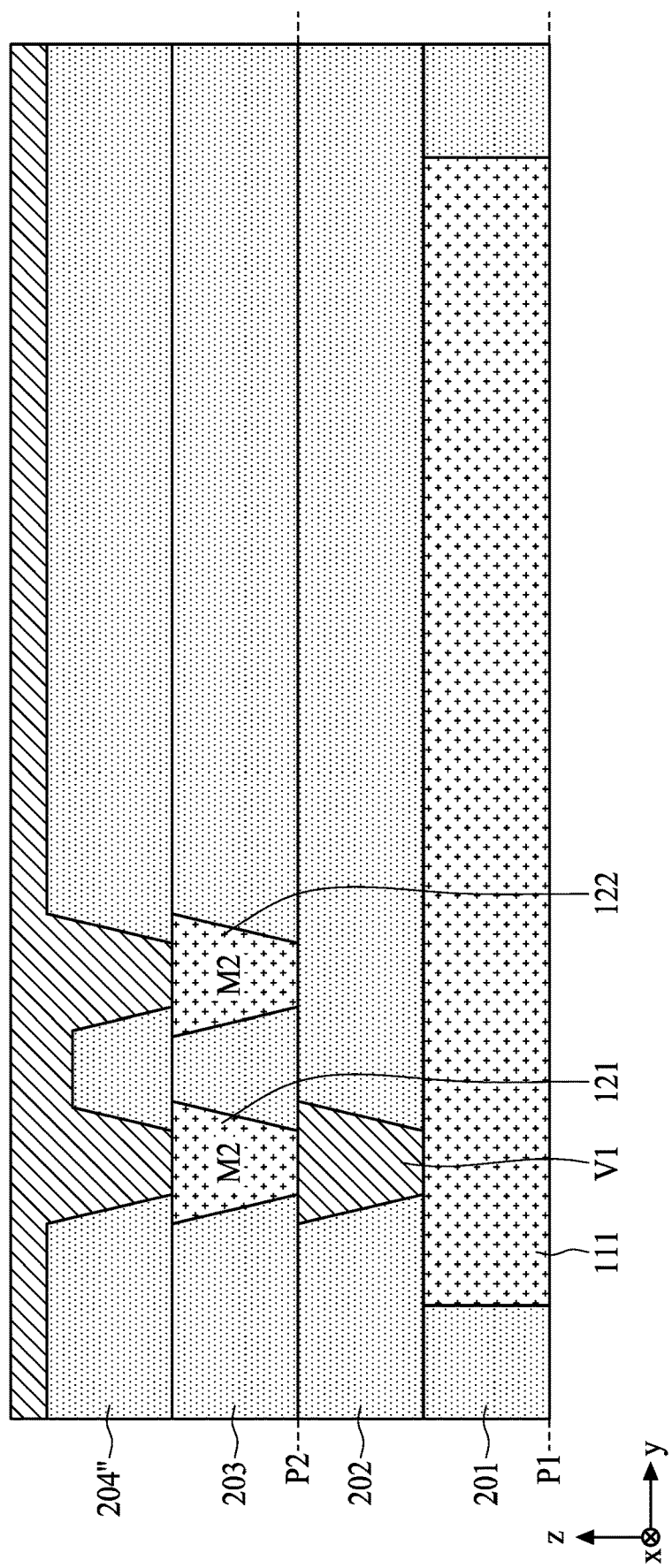

In the embodiment of FIGS. 5A to 5K, the bottom surface of the contact via V3 and the tops of the metal strips 121 and 122 are coplanar. However, this is not a limitation of the present disclosure. FIGS. 7A to 7C are diagrams illustrating a method of manufacturing the semiconductor device 10 based on the embodiments of FIGS. 5A to 5D. In FIG. 7A, a photolithography operation is executed to generate trenches for deposing contact vias. For example, a trench TRE14 is generated over the metal strip 121, and a trench TRE15 is generated over the metal strip 122, wherein the trench TRE14 and the trench TRE15 are connected at the top.

In FIG. 7B, a conductive material is filled in the trenches generated in FIG. 7A. In FIG. 7C, a CMP operation is executed to remove the redundant conductive material to a contact via V3', wherein the contact via V3' bridges between the metal strip 121 and the metal strip 122. Those skilled in the art should readily understand the process of forming the metal strip 131 on the contact via V3', the detailed description is omitted here for brevity. With the contact via V3', when the metal strips 111 and 131 are directed to the voltage source VDD, the increase of the IR drop can be effectively reduced. Likewise, the embodiments of FIGS. 7A to 7C can be adapted for the metal strips 112 and 132 directed to the voltage source VSS. As a result, when the metal strips 112 and 132 are directed to the voltage source VSS, the increase of the IR drop can be effectively reduced.

With the various designs of the contact vias described in the embodiments of FIGS. 2A to 7C, the resistance of the contact vias can be reduced. As a result, the increase of the IR drop can be effectively reduced about 5% to 7%.

Figure 8:
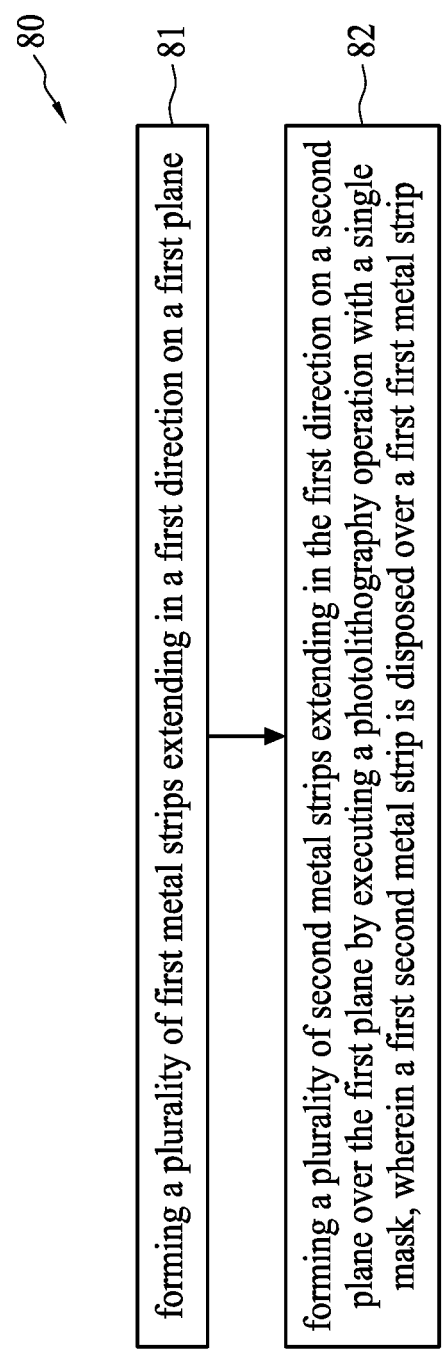
FIG. 8 is a flowchart illustrating a method of manufacturing a semiconductor device in accordance with an embodiment of the present disclosure.

FIG. 8 is a flowchart illustrating a method 80 for manufacturing a semiconductor device in accordance with the embodiment of the present disclosure. Provided that the results are substantially the same, operations shown in FIG. 8 are not required to be executed in the exact order. The method 80 is summarized as follows.

Operation 81: a plurality of first metal strips extending in a first direction are formed on a first plane.

Operation 82: a plurality of second metal strips extending in the first direction are formed on a second plane over the first plane by executing a photolithography operation with a single mask, wherein a first second metal strip is disposed over a first first metal strip.

Those skilled in the art should readily understand the operations 81 and 82 after reading the aforementioned embodiments, the detailed description of the method 80 is omitted here for brevity.

Figure 9:
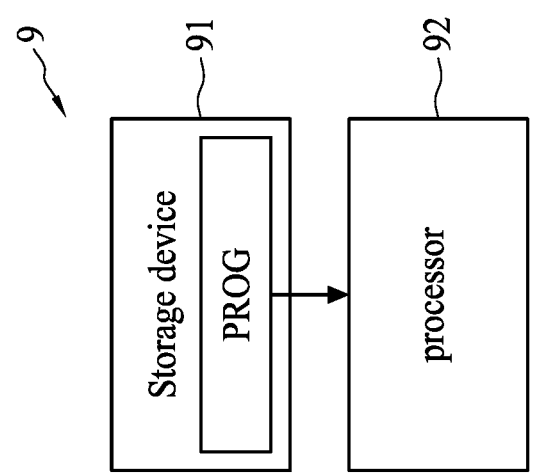
FIG. 9 is a diagram illustrating a system in accordance with an embodiment of the present disclosure.

FIG. 9 is a diagram illustrating a system 90 in accordance with an embodiment of the present disclosure. In this embodiment, the system 90 is a computer or any other device with computing power which should not be a limitation of the present disclosure. As shown in FIG. 9, the system 90 includes a storage device 91 and a processor 92. The storage device 91 is arranged to store a program code PROG. When loaded and executed by the processor 92, the program PROG instructs the processor 92 to execute following operations: forming a plurality of first metal strips extending in a first direction on a first plane; and forming a plurality of second metal strips extending in the first direction on a second plane over the first plane by executing a photolithography operation with a single mask, wherein a first second metal strip is disposed over a first first metal strip; wherein the first first metal strip and the first second metal strip are directed to a first voltage source; wherein a distance between the first second metal strip and a second second metal strip immediate adjacent to the first second metal strip is greater than a distance between the second second metal strip and a third second metal strip immediate adjacent to the second second metal strip.

Those skilled in the art should readily understand the operations of the processor 92 after reading the aforementioned embodiments, the detailed description is omitted here for brevity.

In some embodiments, a semiconductor device is provided. The semiconductor device includes a first metal strip extending in a first direction on a first plane; a second metal strip extending in the first direction on a second plane over the first metal strip; a third metal strip immediate adjacent to the second metal strip and extending in the first direction on the second plane; and a fourth metal strip immediate adjacent to the third metal strip and extending in the first direction on the second plane; wherein the first metal strip and the second metal strip are directed to a first voltage source; wherein a distance between the second metal strip and the third metal strip is greater than a distance between the third metal strip and the fourth metal strip.

In some embodiments, a method of manufacturing a semiconductor device is provided. The method includes: forming a plurality of first metal strips extending in a first direction on a first plane; and forming a plurality of second metal strips extending in the first direction on a second plane over the first plane by executing a photolithography operation with a single mask, wherein a first second metal strip is disposed over a first first metal strip; wherein the first first metal strip and the first second metal strip are directed to a first voltage source; wherein a distance between the first second metal strip and a second second metal strip immediate adjacent to the first second metal strip is greater than a distance between the second second metal strip and a third second metal strip immediate adjacent to the second second metal strip.

In some embodiments, a system is provided. The system includes a storage device and a processor. The storage device is arranged to store a program code. When loaded and executed by the processor, the program code instructs the processor to execute following operations: forming a plurality of first metal strip extending in a first direction on a first plane; and forming a plurality of second metal strips extending in the first direction on a second plane over the first plane by executing a photolithography operation with a single mask, wherein a first second metal strip is disposed over a first first metal strip; wherein the first first metal strip and the first second metal strip are directed to a first voltage source; wherein a distance between the first second metal strip and a second second metal strip immediate adjacent to the first second metal strip is greater than a distance between the second second metal strip and a third second metal strip immediate adjacent to the second second metal strip.

What is claimed is:

1. A semiconductor device, comprising:
   a first metal strip extending in a first direction on a first plane;
   a second metal strip extending in the first direction on a second plane over the first metal strip;
   a third metal strip immediate adjacent to the second metal strip and extending in the first direction on the second plane; and
   a fourth metal strip immediate adjacent to the third metal strip and extending in the first direction on the second plane;
   wherein the first metal strip and the second metal strip are directed to a first voltage source;
   wherein a distance between the second metal strip and the third metal strip is greater than a distance between the third metal strip and the fourth metal strip.

2. The device of claim 1, further comprising:
   a fifth metal strip extending in the first direction on the first plane;
   a sixth metal strip extending in the first direction on the second plane over the fifth metal strip;
   a seventh metal strip immediate adjacent to the sixth metal strip and extending in the first direction on the second plane;
   wherein the fifth metal strip and the sixth metal strip are directed to a second voltage source;
   wherein a distance between the sixth metal strip and the seventh metal strip is greater than the distance between the third metal strip and the fourth metal strip.

3. The device of claim 2, wherein distances of two immediate adjacent metal strips disposed between the second metal strip and the sixth metal strip are consistent.

4. The device of claim 1, further comprising:
   a contact via, connecting between the first metal strip and the second metal strip.

5. The device of claim 1, further comprising:
   an eighth metal strip extending in a second direction on a third plane between the first plane and the second plane;
   a ninth metal strip immediate adjacent to the eighth metal strip and extending in the second direction on the third plane;
   a first contact via, connecting between the first metal strip and the eighth metal strip; and
   a second contact via, connecting between the second metal strip, the eighth metal strip and the ninth metal strip.

6. The device of claim 5, wherein a bottom surface of the second contact via, the top of the eighth metal strip and the top of the ninth metal strip are co-planar.

7. The device of claim 5, wherein the second contact via bridges between the top of the eighth metal strip and the top of the ninth metal strip.

8. The device of claim 1, wherein a width of the second metal strip is wider than a width of the third metal strip.

9. A system, comprising:
   a storage device, arranged to store a program code, a processor, wherein when loaded and executed, the program instructs the processor to execute following operations:
   forming a plurality of first metal strip extending in a first direction on a first plane; and forming a plurality of second metal strips extending in the first direction on a second plane over the first plane by executing a photolithography operation with a single mask, wherein a first second metal strip is disposed over a first first metal strip;

wherein the first first metal strip and the first second metal strip are directed to a first voltage source;

wherein a distance between the first second metal strip and a second second metal strip immediate adjacent to the first second metal strip is greater than a distance between the second second metal strip and a third second metal strip immediate adjacent to the second second metal strip.

10. The system of claim 9, wherein a fourth second metal strip is disposed over a second first metal strip, and the fourth second metal strip and the second first metal strip are directed to a second voltage source; wherein a distance between the fourth second metal strip and a fifth second metal strip immediate adjacent to the fourth second metal strip is greater than the distance between the second second metal strip and the third second metal strip.

11. The system of claim 10, wherein distances of two immediate adjacent metal strips disposed between the first second metal strip and the fourth second metal strip are consistent.

12. The system of claim 9, wherein the program further instructs the processor to execute following operation:

forming a contact via from a top of the first first metal strip to the second plane;

wherein forming the plurality of second metal strips extending in the first direction on the second plane above the first plane by executing the photolithography operation with the single mask comprises:

forming the first second metal strip on a top of the contact via.

13. A semiconductor device, comprising:

a plurality of first metal strips extending in a first direction on a first plane;

a plurality of second metal strips extending in the first direction on a second plane over the first plane, wherein a first second metal strip is disposed over a first first metal strip;

wherein the first first metal strip and the first second metal strip are directed to a first voltage source;

wherein a distance between the first second metal strip and a second second metal strip immediate adjacent to the first second metal strip is greater than a distance between the second second metal strip and a third second metal strip immediate adjacent to the second second metal strip.

14. The semiconductor device of claim 13, wherein a fourth second metal strip is disposed over a second first metal strip, and the fourth second metal strip and the second first metal strip are directed to a second voltage source; wherein a distance between the fourth second metal strip and a fifth second metal strip immediate adjacent to the fourth second metal strip is greater than the distance between the second second metal strip and the third second metal strip.

15. The semiconductor device of claim 14, wherein distances of two immediate adjacent metal strips disposed between the first second metal strip and the fourth second metal strip are consistent.

16. The semiconductor device of claim 13, further comprising a contact via, extending from a top of the first first metal strip to the second plane;

wherein the first second metal strip is formed on a top of the contact via.

17. The semiconductor device of claim 13, further comprising:

a first contact via, extending from a top of the first first metal strip to a third plane between the first plane and the second plane;

a first third metal strip and a second third metal strip, extending in a second direction on the third plane, wherein the first third metal strip is formed on a top of the first contact via; and a second contact via, extending from a top of the first third metal strip and a top of the second third metal strip to the second plane;

wherein the first second metal strip is formed on top of the second contact via.

18. The semiconductor device of claim 17, wherein a bottom surface of the second contact via, the top of the first third metal strip and the top of the second third metal strip are co-planar.

19. The semiconductor device of claim 17, wherein the second contact via bridges between the top of the first third metal strip and the top of the second third metal strip.

20. The semiconductor device of claim 13, wherein a width of the first second metal strip is wider than a width of the second second metal strip.

* * * * *